(12) United States Patent
Choo et al.

(10) Patent No.: US 9,989,588 B2
(45) Date of Patent: Jun. 5, 2018

(54) CLOCK JITTER MEASUREMENT CIRCUIT AND SEMICONDUCTOR DEVICE INCLUDING THE SAME

(71) Applicant: Samsung Electronics Co., Ltd., Suwon-si (KR)

(72) Inventors: Kang-yeop Choo, Seoul (KR); Hyun-ik Kim, Incheon (KR); Tae-ik Kim, Seongnam-si (KR); Ji-hyun Kim, Hwaseong-si (KR); Woo-seok Kim, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/432,731

(22) Filed: Feb. 14, 2017

(65) Prior Publication Data

US 2018/0011142 A1    Jan. 11, 2018

(30) Foreign Application Priority Data

Jul. 8, 2016    (KR) .................. 10-2016-0087117

(51) Int. Cl.
    *H03L 7/06*      (2006.01)
    *G01R 31/317*    (2006.01)
    *H03L 7/091*     (2006.01)
    *H03L 7/183*     (2006.01)

(52) U.S. Cl.
    CPC ........ *G01R 31/31709* (2013.01); *H03L 7/091* (2013.01); *H03L 7/183* (2013.01)

(58) Field of Classification Search
    USPC .................. 327/147–149, 156–158
    See application file for complete search history.

(56) References Cited

U.S. PATENT DOCUMENTS

| | | | |
|---|---|---|---|
| 6,456,109 | B2 | 9/2002 | Urushiyama |
| 6,528,982 | B1 | 3/2003 | Yanagisawa et al. |
| 6,937,106 | B2 | 8/2005 | Chang et al. |
| 7,012,248 | B2 | 3/2006 | Paschalidis |
| 7,406,145 | B2 | 7/2008 | Mori |
| 7,433,440 | B2 | 10/2008 | Noguchi et al. |
| 8,193,963 | B2 | 6/2012 | Wang et al. |
| 8,593,189 | B1 | 11/2013 | Yen et al. |
| 8,773,182 | B1 | 7/2014 | Degani et al. |

(Continued)

OTHER PUBLICATIONS

Takamiya et al. / On-Chip Jitter-Spectrum-Analyzer for High-Speed Digitla Designs / IEEE 2004 / 10 Pages.

(Continued)

*Primary Examiner* — Adam Houston
(74) *Attorney, Agent, or Firm* — Muir Patent Law, PLLC

(57) ABSTRACT

A circuit for measuring clock jitter includes: an internal signal generator configured to generate an internal clock signal and a single pulse signal, respectively synchronized with an input clock signal; a plurality of delay units being connected in series with each other and configured to generate respective delayed clock signals; a plurality of latch circuits configured to latch the single pulse signal in synchronization with the respective delayed clock signals, and output sampling signals; and a count sub-circuit configured to output a count value resulting from counting a number of active sampling signals of the sampling signals.

20 Claims, 23 Drawing Sheets

(56) References Cited

U.S. PATENT DOCUMENTS

| | | | |
|---|---|---|---|
| 8,890,738 B2 | 11/2014 | Kim et al. | |
| 2008/0284633 A1* | 11/2008 | Tanizawa | H03M 1/0678 341/157 |
| 2012/0268184 A1 | 10/2012 | Baumann et al. | |
| 2013/0156135 A1* | 6/2013 | Chiu | H04L 27/38 375/340 |
| 2013/0187688 A1* | 7/2013 | Wang | H03C 5/00 327/156 |
| 2013/0222023 A1* | 8/2013 | Lin | H03L 7/099 327/156 |
| 2014/0118038 A1* | 5/2014 | Lin | H03L 7/105 327/149 |
| 2015/0074156 A1 | 3/2015 | Degani et al. | |
| 2015/0077279 A1* | 3/2015 | Song | G04F 10/005 341/155 |
| 2015/0222278 A1* | 8/2015 | Reichelt | H03L 7/18 327/156 |
| 2016/0034014 A1 | 2/2016 | Turullols et al. | |
| 2016/0118990 A1* | 4/2016 | Faisal | H03K 5/134 327/156 |
| 2016/0156362 A1* | 6/2016 | Kim | H03L 7/189 327/159 |
| 2017/0033955 A1* | 2/2017 | Natarajan | H04L 25/49 |
| 2017/0169877 A1* | 6/2017 | Zerbe | G11C 11/4076 |
| 2017/0324409 A1* | 11/2017 | Martinez | H03K 19/003 |
| 2018/0011142 A1* | 1/2018 | Choo | G01R 31/31709 |
| 2018/0034468 A1* | 2/2018 | Faisal | H03L 7/0997 |

OTHER PUBLICATIONS

Kim et al. / A 0.6V 1.17ps PVT-tolerant and synthesizable time-to-digital converter using stochastic phase interpolation with 16x spatial redundancy in 14nm FinFET technology / IEEE 2015 / 3 Pages.

Khalil et al. / A Self-Calibrated On-Chip Phase-Noise Measurement Circuit With -75 dBc Single-Tone Sensitivity at 100kHz Offset / IEEE Dec. 2007 / 8 Pages.

Ishida et al. / A Programmable On-Chip Picosecond Jitter-Measurement Circuit without a Reference-Clock Input / IEEE 2005 / 3 Pages.

* cited by examiner

CLOCK JITTER MEASUREMENT CIRCUIT AND SEMICONDUCTOR DEVICE INCLUDING THE SAME

CROSS-REFERENCE TO RELATED APPLICATION

This application claims the benefit of Korean Patent Application No. 10-2016-0087117, filed on Jul. 8, 2016, in the Korean Intellectual Property Office, the disclosure of which is incorporated herein in its entirety by reference.

BACKGROUND

The present disclosure relates to a jitter of a clock signal, and more particularly, to a circuit for and a method of measuring a jitter of a clock signal.

A digital circuit may operate in synchronization with a clock signal. For example, the digital circuit may include a plurality of flip-flops, and each of the flip-flops may operate in response to an edge of a clock signal. In addition, function blocks that are included in the digital circuit and operate in synchronization with a clock signal may have different operating frequencies, and thus, a plurality of clock signals having various frequencies may be generated.

A clock signal may have a jitter, and the performance of a function block may be limited by the jitter of the clock signal due to a design made in consideration of the jitter of the clock signal. The jitter of the clock signal may differ between dies (or, chips) due to variations in a semiconductor manufacturing process, may vary depending on the temperature of a digital circuit or a voltage applied to the digital circuit, and may depend on the performance a phase locked loop (PLL) generating the clock signal.

SUMMARY

The present disclosure provides a clock jitter measurement circuit and a semiconductor device including the clock jitter measurement circuit.

The present disclosure also provides a method of measuring clock jitter.

According to an aspect of the inventive concept, there is provided a circuit for measuring clock jitter, the circuit including: an internal signal generator configured to generate an internal clock signal and a single pulse signal, respectively synchronized with an input clock signal; a plurality of delay units connected in series with each other and configured to generate respective delayed clock signals, wherein the internal clock signal sequentially passes through the plurality of delay units; a plurality of latch circuits configured to latch the single pulse signal in synchronization with the respective delayed clock signals and output sampling signals; and a count sub-circuit configured to output a count value resulting from counting a number of active sampling signals from among the sampling signals.

According to another aspect of the inventive concept, there is provided a semiconductor device including: a function block including one or more circuits, and configured to receive an input clock signal and operate in synchronization with the input clock signal; a clock jitter measurement circuit configured to measure jitter of the input clock signal based on sampling signals obtained by latching a single pulse signal in synchronization with a plurality of delayed clock signals generated by delaying the input clock signal, wherein the single pulse signal is synchronized with the input signal; and a performance control circuit configured to adjust performance of the one or more circuits of the function block based on the measured jitter.

According to another aspect of the inventive concept, there is provided a method of measuring clock jitter, the method including: generating an internal clock signal synchronized with an input clock signal and generating a plurality of delayed clock signals by delaying the internal clock signal; generating a single pulse signal synchronized with the input clock signal; outputting sampling signals that include active and inactive sampling signals, including the active sampling signals by latching the single pulse signal in synchronization with the plurality of delayed clock signals; and counting the number of active sampling signals from among the sampling signals.

According to still another aspect of the inventive concept, there is provided a semiconductor device including: a clock generator configured to generate an input clock signal in synchronization with an external clock signal, an internal signal generator configured to generate an internal clock signal in synchronization with the input clock signal, and generate a pulse signal having an active period of time during 1 to n-1 clock periods for every set of n clock periods of the input clock signal, n being equal to or greater than 3, a plurality of unit cells connected in series with each other, and configured to generate sampling signals based on the pulse signal and a plurality of delayed clock signals that are generated by sequentially delaying the input clock signal, and a count circuit configured to output a jitter information signal based on a count value resulting from counting a number of active sampling signals from among the sampling signals during the active period of time of the pulse signal. The clock generator is configured to adjust the input clock signal based on the jitter information signal.

BRIEF DESCRIPTION OF THE DRAWINGS

Example embodiments of the inventive concept will be more clearly understood from the following detailed description taken in conjunction with the accompanying drawings in which.

DETAILED DESCRIPTION

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as that, although the terms first, second, third etc. may be used herein to describe various elements, these elements should not be elements of the list.

The described embodiments may be used in a semiconductor device including a clock jitter measurement circuit or system or electronic device including the semiconductor device, such as a system on chip (SoC), an application processor (AP), a central processing unit (CPU), a graphics processing unit (GPU), a mobile phone, a smart phone, a personal digital assistants (PDA), a portable multimedia player (PMP), a digital camera, a digital television, a set-top box, a music player, a portable game console, a navigation device, a personal computer (PC), a server computer, a workstation, a tablet computer, a laptop computer, a smart card, a printer, etc.

Figure 1:
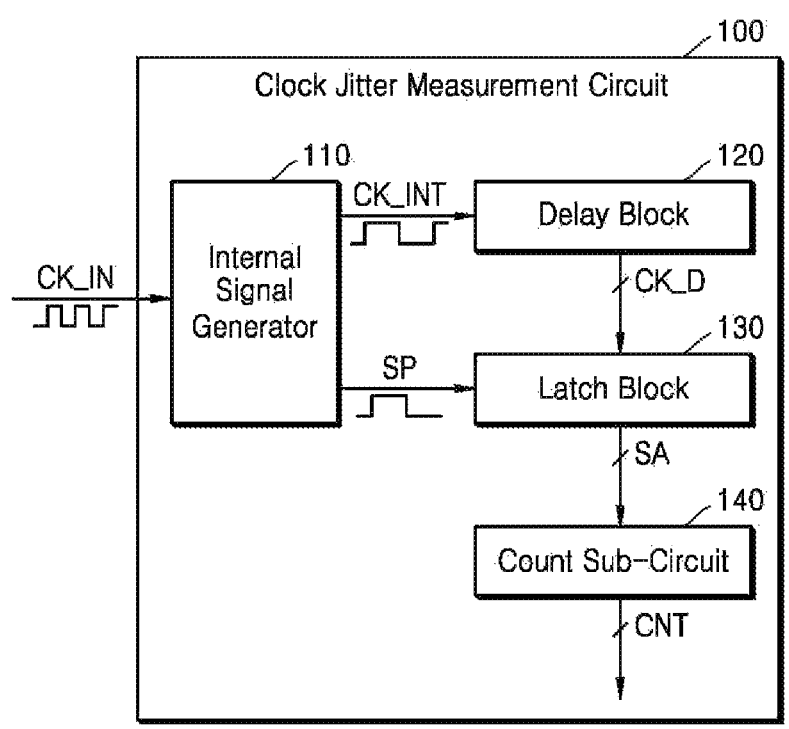
FIG. 1 is a block diagram of a clock jitter measurement circuit according to an example embodiment.
Figure 2:
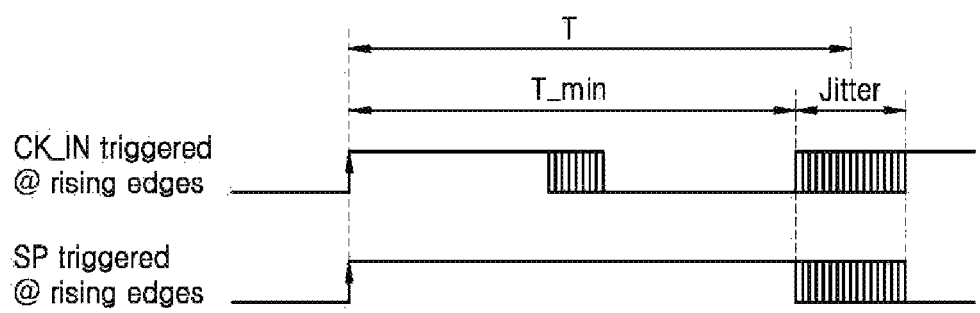
FIG. 2 is a timing diagram of an input clock signal and a single pulse signal of FIG. 1, according to an example embodiment.

FIG. 1 is a block diagram of a clock jitter measurement circuit 100 according to an example embodiment, and FIG. 2 is a timing diagram of an input clock signal CK_IN and a single pulse signal SP of FIG. 1, according to an example embodiment. The input clock signal CK_IN may be generated from a clock generator such as a phase locked loop (PLL), a delay locked loop (DLL) and an oscillator. The clock jitter measurement circuit 100 may be manufactured by a semiconductor process and may be included in a semiconductor device. As shown in FIG. 1, the clock jitter measurement circuit 100 may receive the input clock signal CK_IN and measure a jitter of the input clock signal CK_IN.

Referring to FIG. 2, although the input clock signal CK_IN is generated to have a period "T", a function block receiving the input clock signal CK_IN may experience a deviation of the period "T" of the input clock signal CK_IN, which occurs due to various factors. The function block included in a semiconductor device may include one or more circuits to operate the semiconductor device. As shown in FIG. 2, when overlapping rising edges of the input clock signal CK_IN, a region in which next rising edges of the input clock signal CK_IN occurs may represent a jitter of the input clock signal CK_IN. The jitter of the input clock signal CK_IN may limit the performance of a function block that operates in synchronization with the input clock signal CK_IN. For example, a delay time of a critical path of a function block receiving the input clock signal CK_IN has to satisfy "T_min" or less which is shorter than the period "T".

The jitter of the input clock signal CK_IN may vary due to various factors. For example, the input clock signal CK_IN may vary due to a process, voltage and temperature (PVT) variation. In other words, although digital circuits are identically designed and manufactured, the jitter of the input clock signal CK_IN may be different between dies (or chips) due to variations in a semiconductor manufacturing process and may increase or decrease due to the temperature of a digital circuit and/or a voltage applied to the digital circuit. A designer may allocate a high margin to the input clock signal CK_IN in consideration of a variation in the jitter of the input clock signal CK_IN when designing a function block, and thus, the performance of the function block may be further limited.

Referring to FIG. 1, the clock jitter measurement circuit 100 according to the present example embodiment may optimize the performance of a function block and the performance of a digital circuit including the function block by accurately measuring the period T of the input clock signal CK_IN to measure the jitter of the input clock signal CK_IN. Also, as described below, the clock jitter measurement circuit 100 may be digitally synthesized since it does not include an analog circuit such as an amplifier. In other words, the clock jitter measurement circuit 100 may be implemented with standard cells included in a standard cell library. Accordingly, the clock jitter measurement circuit 100 may be easily implemented together with other blocks of a digital circuit and may be widely used in various applications. Also, the clock jitter measurement circuit 100 is insensitive to a PVT variation due to a structural feature to be described below, and thus, the jitter of the input clock signal CK_IN may be accurately measured without compensating the PVT variation.

As shown in FIG. 1, the clock jitter measurement circuit 100 may include an internal signal generator 110, a delay block 120, a latch block 130, and a count sub-circuit (or, a count circuit) 140. The internal signal generator 110 may receive the input clock signal CK_IN and may generate an internal clock signal CK INT and the single pulse signal SP. The internal clock signal CK_INT and the single pulse signal SP, which are generated by the internal signal generator 110, may be synchronized with the input clock signal CK_IN. For example, the internal clock signal CK_INT may be generated by dividing the input clock signal CK_IN, and the single pulse signal SP may be activated or deactivated (e.g., set to an active state or inactive state) in synchronization with an edge of the input clock signal CK_IN. For example, as shown in FIG. 2, in order to measure the period T of the input clock signal CK_IN, the internal signal generator 110 may generate a single pulse signal SP having an active pulse width equal to the period T of the input clock signal CK_IN.

The delay block 120 may receive the internal clock signal CK_INT from the internal signal generator 110 and may generate a plurality of delayed clock signals CK_D. The delay block 120 may include a plurality of delay units connected in series with each other, and the internal clock signal CK_INT may be input to a first delay unit of the plurality of delay units. Each of the delayed clock signals CK_D may be an output signal of each of the delay units. The delay block 120 will be described below in detail with reference to FIGS. 3 and 4. As used herein, a "unit" and a "block" may refer to a "circuit."

The latch block 130 may receive the plurality of delayed clock signals CK_D from the delay block 120, may receive the single pulse signal SP from the internal signal generator 110, and may generate a plurality of sampling signals SA. The latch block 130 may include a plurality of latch circuits, and the plurality of latch circuits may latch the single pulse signal SP in synchronization with the plurality of delayed clock signals CK_D. In other words, each of the latch circuits may latch the single pulse signal SP in synchronization with one of the delayed clock signals CK_D input thereto, and thus may output one of active or inactive sampling signals SA. As a result, the number of the delay units of the delay block 120, the number of the latch circuits of the latch block 130, and the number of the delayed clock signals CK_D, and the number of the sampling signals SA may be equal to each other. The latch block 130 will be described below in detail with reference to FIGS. 5 and 6.

The count sub-circuit 140 may receive the plurality of sampling signals SA from the latch block 130 and may output a count signal CNT. The count sub-circuit 140 may count the number of active sampling signals of the plurality of sampling signals SA and may output a count signal CNT indicating the number of the active sampling signals. A value of the count signal CNT output from the count sub-circuit 140 may be proportional to an active pulse width of the single pulse signal SP. Accordingly, when the single pulse signal SP has an active pulse width equal to the period T of the input clock signal CK_IN, the value of the count signal CNT may be proportional to the period T of the input clock signal CK_IN. That is, the period T of the input clock signal CK_IN is measured. The count sub-circuit 140 will be described below in detail with reference to FIGS. 14A and 14B.

Figure 3:
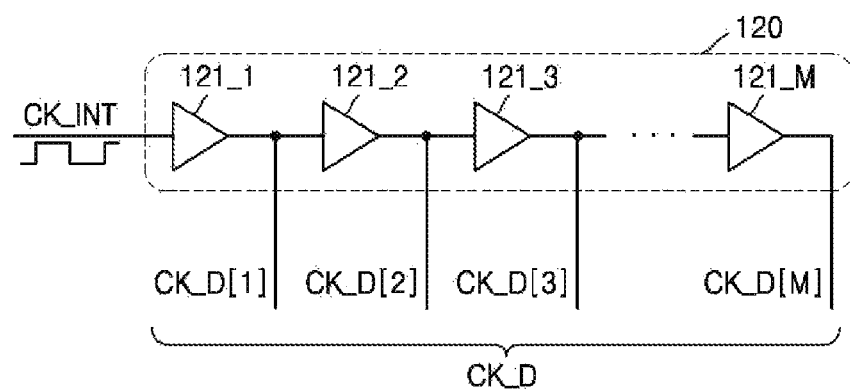
FIG. 3 is a block diagram of a delay block of FIG. 1, according to an example embodiment.
Figure 4:
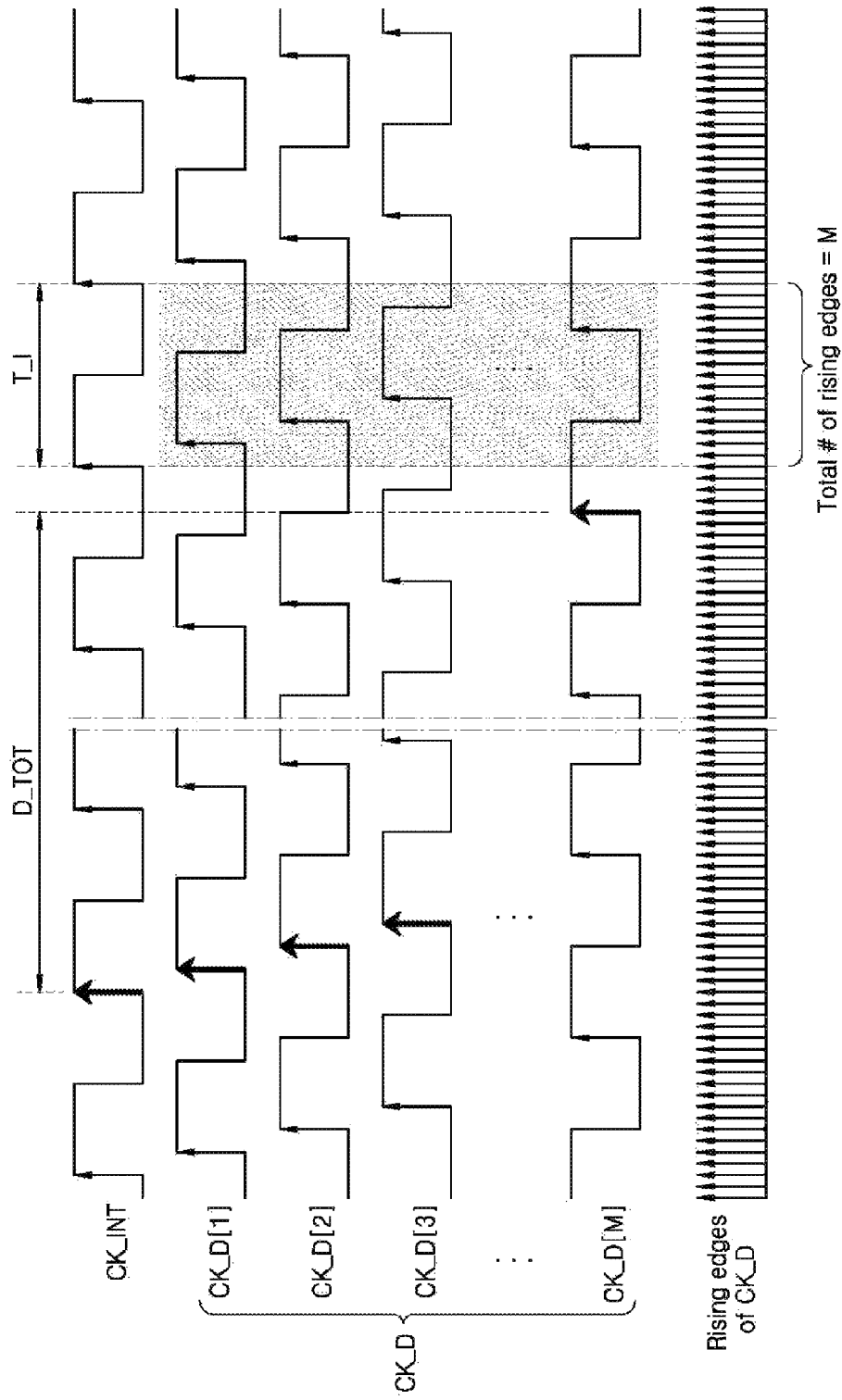
FIG. 4 is a timing diagram of delayed clock signals, which are output signals of the delay block of FIG. 1, according to an example embodiment.

FIG. 3 is a block diagram of the delay block 120 of FIG. 1, according to an example embodiment, and FIG. 4 is a timing diagram of delayed clock signals CK_D, which are output signals of the delay block 120, according to an example embodiment. As described above with reference to FIG. 1, the delay block 120 may receive the internal clock signal CK_INT from the internal signal generator 110 of FIG. 1 and may output the delayed clock signals CK_D to the latch block 130 of FIG. 1.

Referring to FIG. 3, the delay block 120 may include M delay units 121_1 to 121_M connected in series with each other (where M is an integer that is equal to or greater than 2). The internal clock signal CK INT may be input to a first delay unit 121_1 of the M delay units 121_1 to 121_M, and signals CK_D[1] to CK_D[M], which are output from the M delay units 121_1 to 121_M, respectively, may constitute the delayed clock signals CK_D. The internal clock signal CK_INT passes through each delay unit of the M delay units 121_1 to 121_M in sequentially delayed manner. Accordingly, as shown in FIG. 4, the delayed clock signals CK_D may include M clock signals that represent the internal clock signal CK_INT having different delays.

Referring to FIG. 4, the delayed clock signal CK_D[M], which is an output of a last delay unit 121_M of the M delay units 121_1 to 121_M, may be a signal delayed by a time "D_TOT" compared to the internal clock signal CK_INT. In other words, a total delay time of the M delay units 121_1 to 121_M of FIG. 3 may be the time "D_TOT". As shown in FIG. 4, the number of rising edges of the M delayed clock signals CK_D[1] to CK_D[M], generated within a period "T_I" of the internal clock signal CK_INT, may be constant as M. Although a delay time of each of the delay units 121_1 to 121_M is changed due to a noise or a PVT variation occurs, M may remain constant. Based on such characteristics, the length of a time interval At may be measured by counting the number of rising edges of the M delayed clock signals CK_D[1] to CK_D[M], generated during the time interval At that is shorter than the period "T_I" of the internal clock signal CK_INT. A circuit converting a time interval into a digital value may be referred to as a time-to-digital converter (TDC), and a circuit converting a time interval into a digital value by using a plurality of delayed clock signals having different delays, as shown in FIGS. 3 and 4, may be referred to as a stochastic TDC.

Each of the delay units 121_1 to 121_M shown in FIG. 3 is a circuit, which delays input signal and outputs a delayed signal, and may be implemented by various methods. For example, each of the delay units 121_1 to 121_M may include two inverters connected in series. In an example embodiment, each of the M delay units 121_1 to 121_M may have the same structure and the same delay time.

Figure 5:
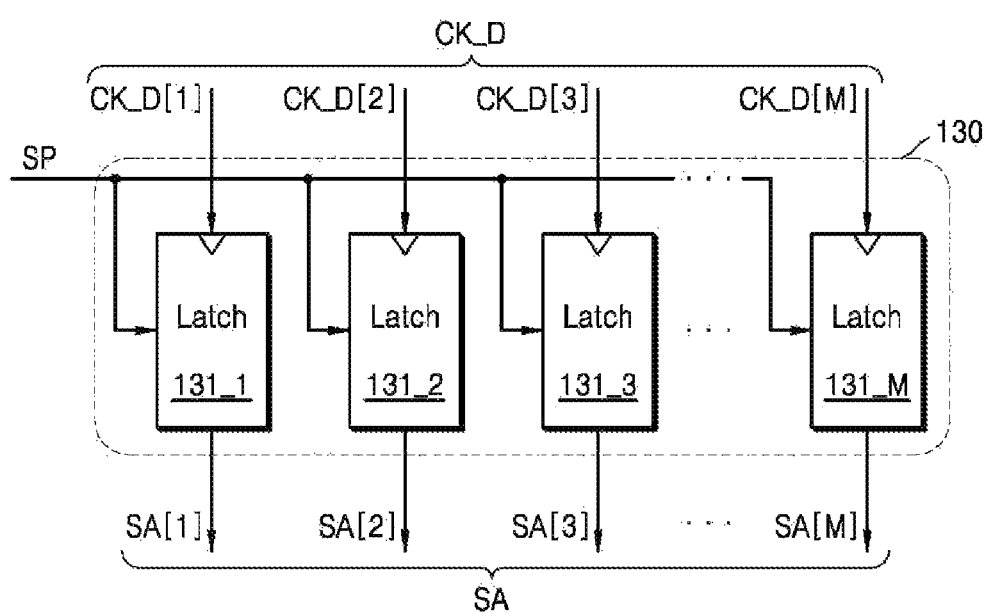
FIG. 5 is a block diagram of a latch block of FIG. 1, according to an example embodiment.
Figure 6:
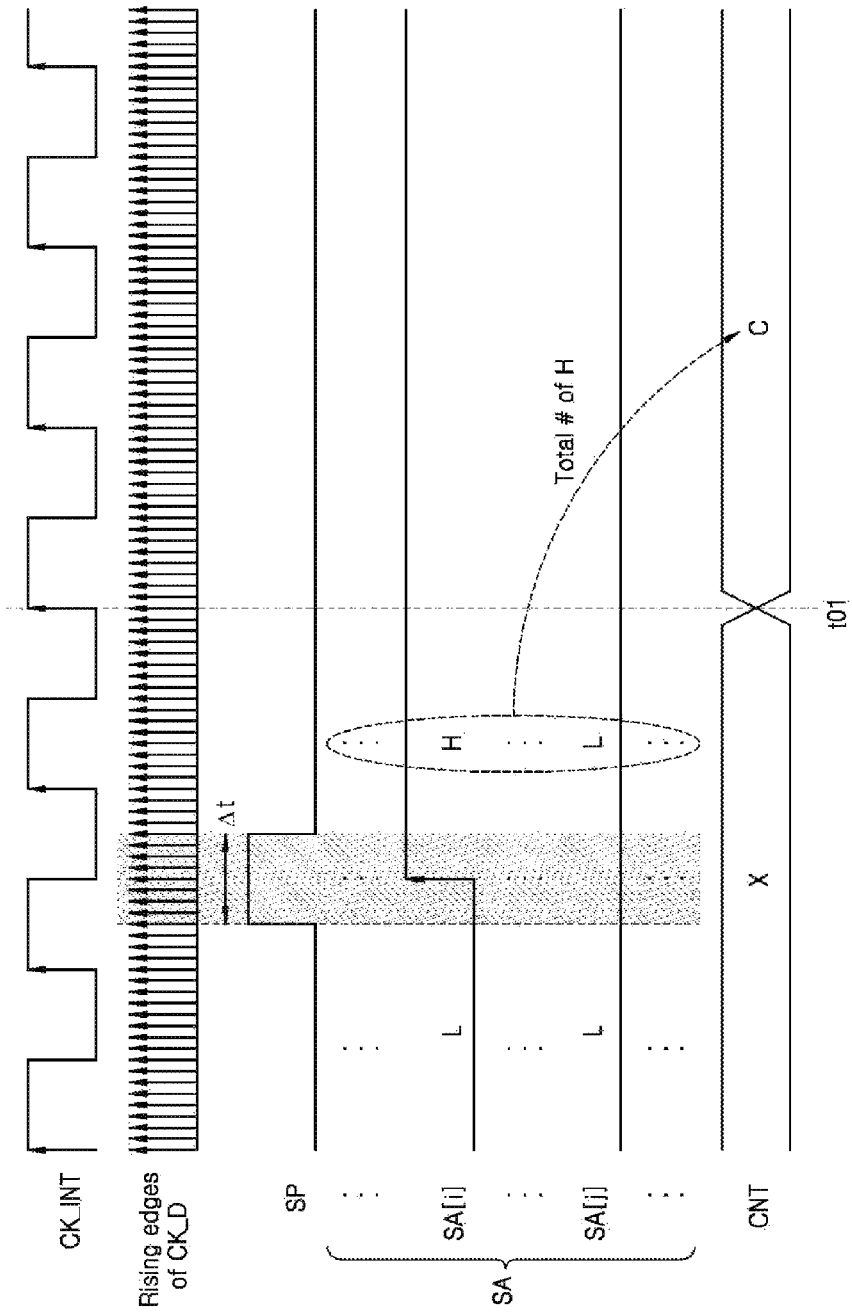
FIG. 6 is a timing diagram of a plurality of sampling signals, which are output signals of the latch block of FIG. 1, according to an example embodiment.

FIG. 5 is a block diagram of the latch block 130 of FIG. 1, according to an example embodiment, and FIG. 6 is a timing diagram of a plurality of sampling signals SA, which are output signals of the latch block 130, according to an example embodiment. As described above with reference to FIG. 1, the latch block 130 may receive the plurality of delayed clock signals CK_D from the delay block 120, may receive the single pulse signal SP from the internal signal generator 110, and may output the plurality of sampling signals SA.

Referring to FIG. 5, the latch block 130 may include M latch circuits 131_1 to 131_M. The M latch circuits 131_1 to 131_M (hereinafter, referred to as first to M-th latch circuits) may receive the M delayed clock signals CK_D[1] to CK_D[M] (hereinafter, referred to first to M-th delayed clock signals), respectively, from the delay block 120 of FIG. 3, may receive, in common, the single pulse signal SP from the internal signal generator 110 of FIG. 1, and may output M sampling signals SA[1] to SA[M] (hereinafter, referred to as first to M-th sampling signals), respectively. For example, the first latch circuit 131_1 may receive the first delayed clock signal CK_D[1] and the single pulse signal SP and may output the first sampling signal SA[1] by latching the single pulse signal SP in synchronization with the first delayed clock signal CK_D[1].

In example embodiments, each of the first to M-th latch circuits may be a D flip-flop circuit including an input terminal D, a clock terminal CLK, and an output terminal Q. For example, the single pulse signal SP may be provided to the input terminal D, one of the first to M-th delayed clock signals may be provided to the clock terminal CLK and one of the first to M-th sampling signals may output from the output terminal Q.

Referring to FIG. 6, the single pulse signal SP may be activated during a time interval Δt, and a latch circuit, which receives one of the first through M delayed clock signals which has a rising edge during the time interval Δt, may output an active sampling signal. For example, as shown in FIG. 6, a sampling signal SA[i] may be activated (that is, transition from a low level "L" to a high level "H," hereinafter, referred to an active sampling pulse) by a delayed clock signal CK_D[i] having a rising edge during the time interval Δt, whereas a sampling signal SA[j] may remain inactive (that is, remain at a low level "L," hereinafter, referred to inactive sampling pulse) since a delayed clock signal CK_D[j] does not have a rising edge during the time interval Δt. After the single pulse signal SP is deactivated, the count sub-circuit 140 of FIG. 1 may output a count signal CNT, which has a value "C" indicating the number of sampling signals activated at a time t01, by counting active sampling signals (that is, sampling signals having a high level "H") of the sampling signals SA. Since the value "C" is proportional to the time interval Δt and the number "M" of delay units of the delay block 120 corresponds to the period "T_I" of the internal clock signal CK_INT, as described above with reference to FIG. 4, the time interval Δt may be calculated from the value "C", as indicated in the following Equation (1).

$$\Delta t = T\_I * C * 1/M \quad (1)$$

Figure 7:
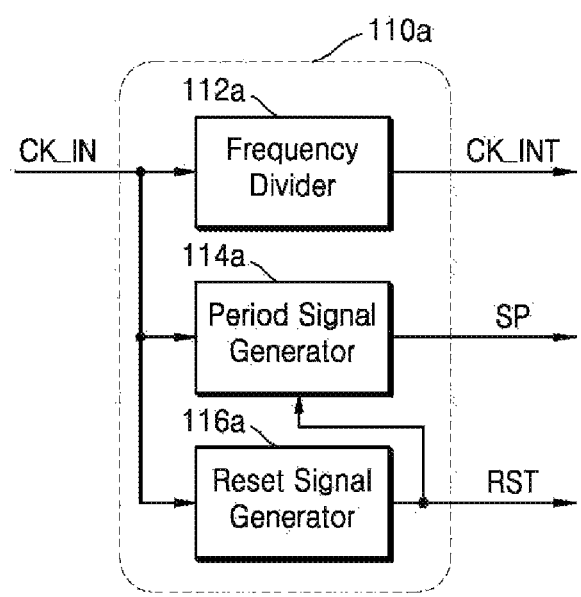
FIG. 7 is a block diagram of an internal signal generator, which is an example of an internal signal generator of FIG. 1, according to an example embodiment.
Figure 8A:
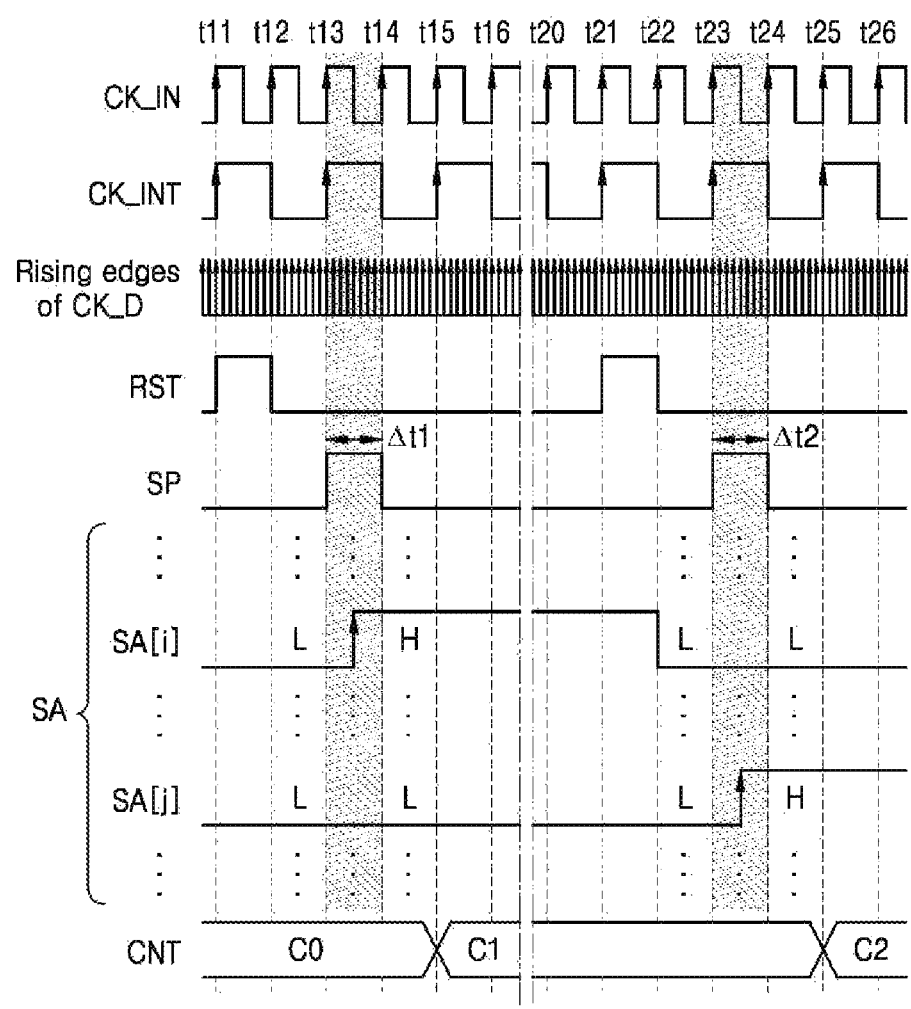
FIGS. 8A and 8B are timing diagrams of output signals of the internal signal generator of FIG. 7, according to example embodiments.
Figure 8B:
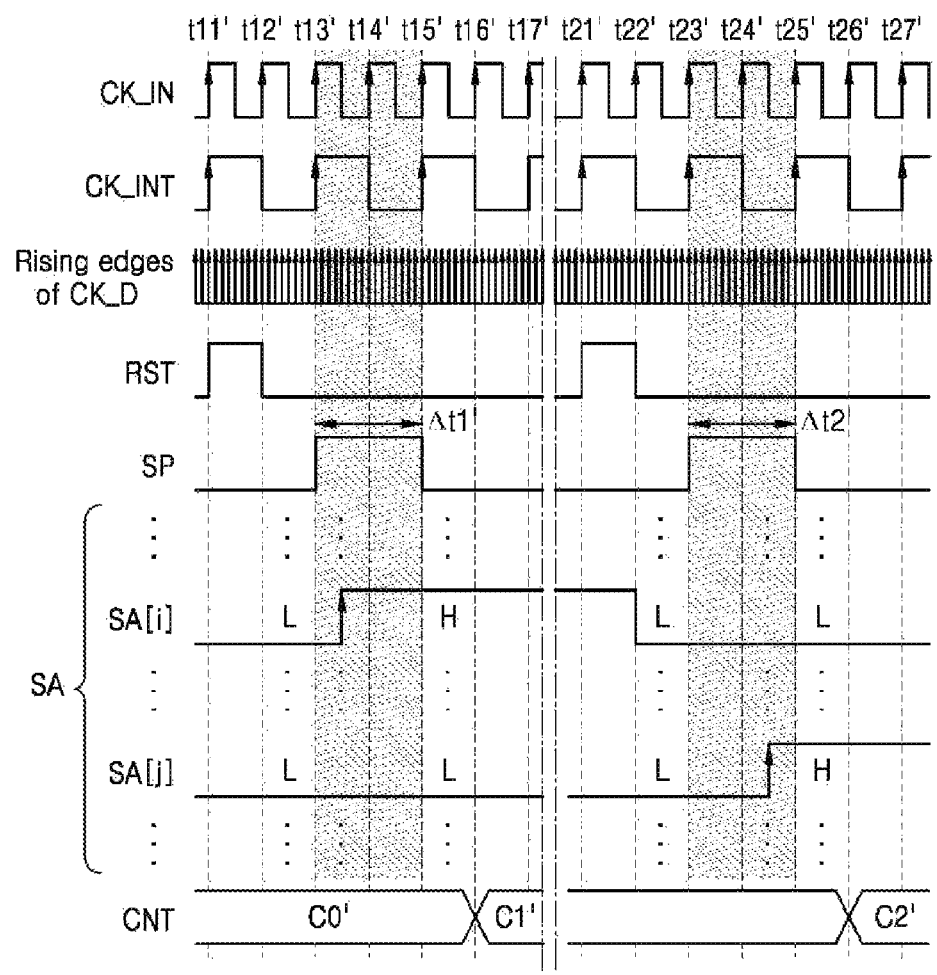

FIG. 7 is a block diagram of an internal signal generator 110a, which is an example of the internal signal generator 110 of FIG. 1, according to an example embodiment, and FIGS. 8A and 8B are timing diagrams of output signals of the internal signal generator 110a of FIG. 7, according to example embodiments. As described above with reference to FIG. 1, the internal signal generator 110a may receive an input clock signal CK_IN, may generate an internal clock signal CK_INT and a single pulse signal SP, synchronized with the input clock signal CK_IN, and may provide the internal clock signal CK_INT to the delay block 120 of FIG. 1 and the single pulse signal SP to the latch block 130 of FIG. 1. The internal signal generator 110a of FIG. 7 may further generate a reset signal RST, compared with the internal signal generator 110 of FIG. 1. Referring to FIG. 7, the internal signal generator 110a may include a frequency divider 112a, a period signal generator 114a, and a reset signal generator 116a.

The frequency divider 112a may generate the internal clock signal CK_INT by dividing the input clock signal CK_IN. For example, as shown in FIGS. 8A and 8B, the frequency divider 112a may generate an internal clock signal CK_INT, which has a period that is twice the period of the input clock signal CK_IN, by dividing the input clock signal CK_IN. In order to divide the input clock signal CK_IN by two, the frequency divider 112a may include, for example, a flip-flop that receives the input clock signal CK_IN and has a data input port and a data output port which are connected via an inverter. In order to divide the input clock signal CK_IN by four, the frequency divider 112a may include, for example, first and second flip-flops receiving the input clock signal CK_IN in common and connected in series, and a data input port of the first flip-flop and a data output port of the second flip-flop are connected via an inverter. Besides, it will be understood that the frequency divider 112a may be variously implemented.

According to the present example embodiment, the frequency of the internal clock signal CK_INT may be equal to that of the input clock signal CK_IN, and the frequency divider 112a may be function as a clock buffer. A division ratio of the frequency divider 112a may be determined by the frequency of the input clock signal CK_IN. When the input clock signal CK_IN has a relatively high frequency, for example, when the period of the input clock signal CK_IN is less than or similar to a delay time of a delay unit of the delay block 120, the frequency divider 112a may have a high division ratio so that the period of the internal clock signal CK_INT which is input to the delay block 120 is greater than the delay time of the delay unit of the delay block 120.

The internal clock signal CK_INT generated by the frequency divider 112a may be synchronized with the input clock signal CK_IN. In other words, a time interval between a rising edge of the internal clock signal CK_INT and a rising edge of the input clock signal CK_IN may be constant. Although FIGS. 8A and 8B shows examples in which a rising edge of the internal clock signal CK_INT and a rising edge of the input clock signal CK_IN occur at the same point in time, the inventive concept is not limited thereto.

The period signal generator 114a may generate a single pulse signal SP having an active pulse width that is proportional to the period of the input clock signal CK_IN. The single pulse signal SP may be periodically activated and deactivated. In an example embodiment, as shown in FIG. 8A, the period signal generator 114a may generate a single pulse signal SP having an active pulse width Δt1 and Δt2 that corresponds to the period of the input clock signal CK_IN. In another example embodiment, as shown in FIG. 8B, the period signal generator 114a may generate a single pulse signal SP having an active pulse width Δt1' and Δt2' that corresponds to twice the period of the input clock signal CK_IN. For example, the period signal generator 114a may include a toggle flip-flop that receives the input clock signal CK_IN. As described above, since the active pulse width of the single pulse signal SP is proportional to a value of a count signal CNT, the active pulse width of the single pulse signal SP may be calculated based on the count signal CNT.

The single pulse signal SP generated by the period signal generator 114a may be synchronized with the input clock signal CK_IN. In other words, a time interval between a rising edge of the single pulse signal SP and a rising edge of the input clock signal CK_IN and a time interval between a falling edge of the single pulse signal SP and a rising edge of the input clock signal CK_IN may be constant. Since the single pulse signal SP as well as the internal clock signal CK_INT is also synchronized with input clock signal CK_IN, a jitter of the input clock signal CK_IN may be measured without using a reference signal (for example, a reference clock signal). Accordingly, the clock jitter measurement circuit 100 of FIG. 1 may be easily implemented and be used in various applications.

The reset signal generator 116a may generate a reset signal RST that is periodically activated and deactivated. After an active pulse width of the single pulse signal SP is measured, the reset signal RST may be activated and deactivated in order to measure next active pulse width of the single pulse signal SP. For example, the reset signal generator 116a may be implemented with a counter receiving the input clock signal CK_IN, or may be implemented with a state machine. As shown in FIG. 7, the period signal generator 114a may receive the reset signal RST and may generate a single pulse signal SP having an active pulse in response to the reset signal RST. In addition, the latch block 130 and the count sub-circuit 140 of FIG. 1 may receive the reset signal RST and may start an operation for measuring an active pulse width of the single pulse signal SP in response to the reset signal RST. Although FIG. 7 shows an example in which the reset signal generator 116a receives the input clock signal CK_IN and generates a reset signal RST synchronized with the input clock signal CK_IN, the reset signal generator 116a may receive the internal clock signal CK_INT and generate a reset signal RST synchronized with the internal clock signal CK_INT.

Referring to FIG. 8A, the reset signal RST may be activated at a time t11 and be deactivated at a time t12. In response to an active pulse of the reset signal RST, the period signal generator 114a may generate a single pulse signal SP having the active pulse width Δt1 corresponding to the period of the input clock signal CK_IN around the time t13, and sampling signals SA may be set to a deactivation state (that is, a low level "L").

Some of the sampling signals SA may be activated (that is, transition from a low level "L" to a high level "H") by some of delayed clock signals CK_D, which have rising edges during the active pulse width Δt1 of the single pulse signal SP. The count sub-circuit 140 of FIG. 1 may count a number of active sampling signals of the sampling signals SA and output a count signal CNT having a value "C1" at a time t15.

In order to measure the period of the input clock signal CK_IN again, the reset signal RST may be activated at a time t21 and be deactivated at a time t22. At a time t22, a sampling signal SA[i] is deactivated (that is, transition to a low level "L") in response to the active reset signal RST. Next, a count signal CNT having a value "C2" corresponding to the active pulse width Δt2 of the single pulse signal SP may be output at a time t25.

Referring to FIG. 8B, a single pulse signal SP generated by the period signal generator 114a of FIG. 7 may have active pulse widths Δt1' and Δt2'. In FIG. 8B, the active pulse widths Δt1' and Δt2' are twice the period of the input clock signal CK_IN. The number of active sampling signals included among the sampling signals SA in the example embodiment of FIG. 8B may be greater than that in the example embodiment of FIG. 8A since the active pulse width of the single pulse signal SP shown in FIG. 8B has been increased. In addition, the count signal CNT, which indicates the number of active sampling signals included among the sampling signals SA, may be output at a delayed point in time compared with the example embodiment of FIG. 8A.

Figure 9:
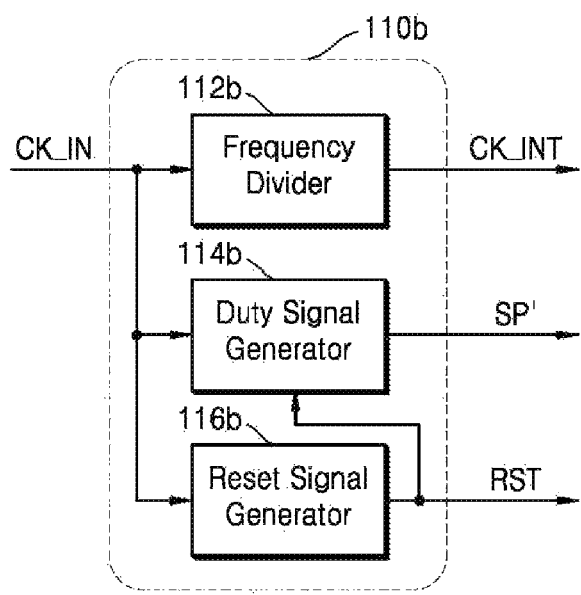
FIG. 9 is a block diagram of an internal signal generator, which is an example of the internal signal generator of FIG. 1, according to an example embodiment.
Figure 10:
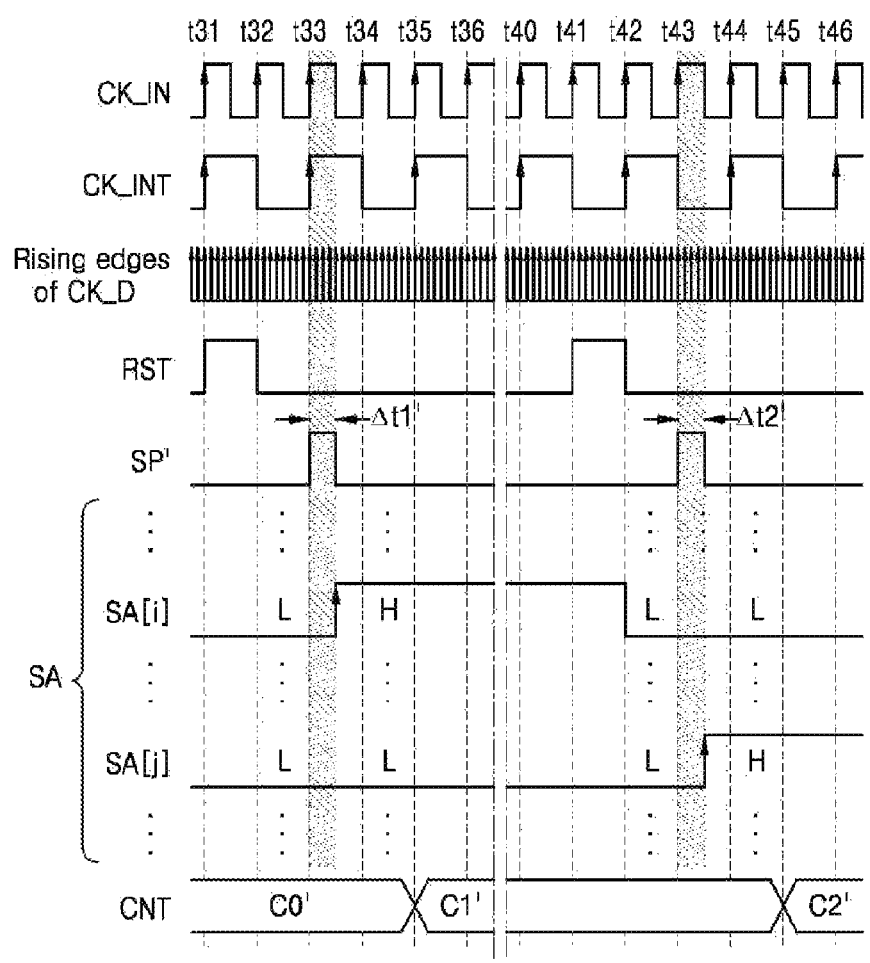
FIG. 10 is a timing diagram of output signals of the internal signal generator of FIG. 9, according to an example embodiment.

FIG. 9 is a block diagram of an internal signal generator 110b, which is an example of the internal signal generator 110 of FIG. 1, according to an example embodiment, and FIG. 10 is a timing diagram of output signals of the internal signal generator 110b of FIG. 9, according to an example embodiment. Referring to FIG. 9, the internal signal generator 110b may include a frequency divider 112b, a duty signal generator 114b, and a reset signal generator 116b. The frequency divider 112b and the reset signal generator 116b of FIG. 9 may be the same as or similar to the frequency divider 112a and the reset signal generator 116a of FIG. 7, respectively.

According to the present example embodiment, the clock jitter measurement circuit 100 of FIG. 1 may be used to measure a clock duty cycle, like a clock duty sensor, as well as to measure clock jitter. In other words, in order to measure a duty cycle of an input clock signal CK_IN, the internal signal generator 110b may generate a single pulse signal SP' having an active pulse width corresponding to a positive pulse width or negative pulse width of the input clock signal CK_IN. As described with reference FIG. 4, since the number (for example, M) of rising edges of delayed clock signals CK_D, which occur during a period of the input clock signal CK_IN, is constant, the duty cycle of the input clock signal CK_IN may be measured by measuring a positive or negative pulse width of the input clock signal CK_IN, that is, counting the number of rising edges of the delayed clock signals CK_D, which occur during a positive or negative pulse width of the input clock signal CK_IN.

Referring to FIG. 10, a reset signal RST may be activated at a time t31 and be deactivated at a time t32. In response to an active pulse of the reset signal RST, the duty signal generator 114b may generate a single pulse signal SP' having an active pulse width Δt1' corresponding to a positive or negative pulse width of the input clock signal CK_IN around a time t33, and sampling signals SA may be set to a deactivation state (that is, a low level "L") at the time t31.

Some of the sampling signals SA may be activated (that is, transition from a low level "L" to a high level "H") by some of the delayed clock signals CK_D, which have rising edges during the active pulse width Δt1' of the single pulse signal SP'. A count signal CNT having a value "C1" indicating the number of active sampling signals of the sampling signals SA may be output at a time t35. Similarly, an operation of measuring an active pulse width Δt2' of the single pulse signal SP may be performed between a time t41 and a time t45, and a count signal having a value "C2" may be output at the time t45.

Figure 11:
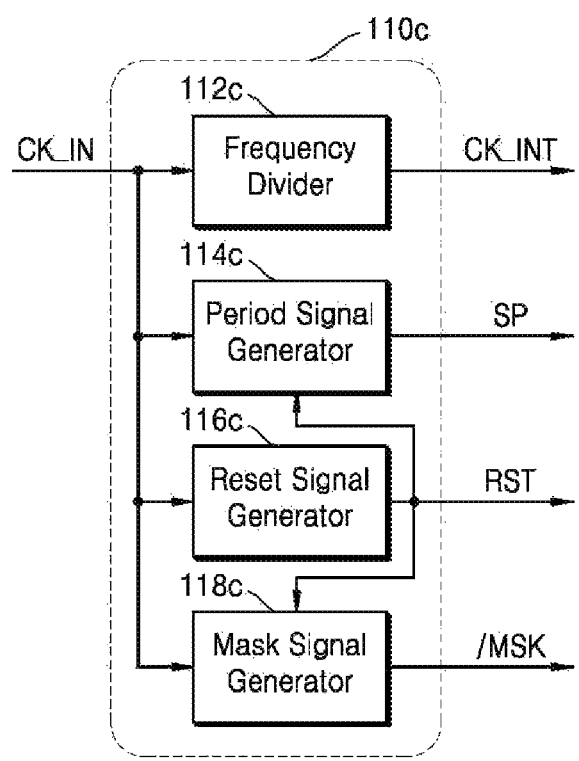
FIG. 11 is a block diagram of an internal signal generator, which is an example of the internal signal generator of FIG. 1, according to an example embodiment.
Figure 12:
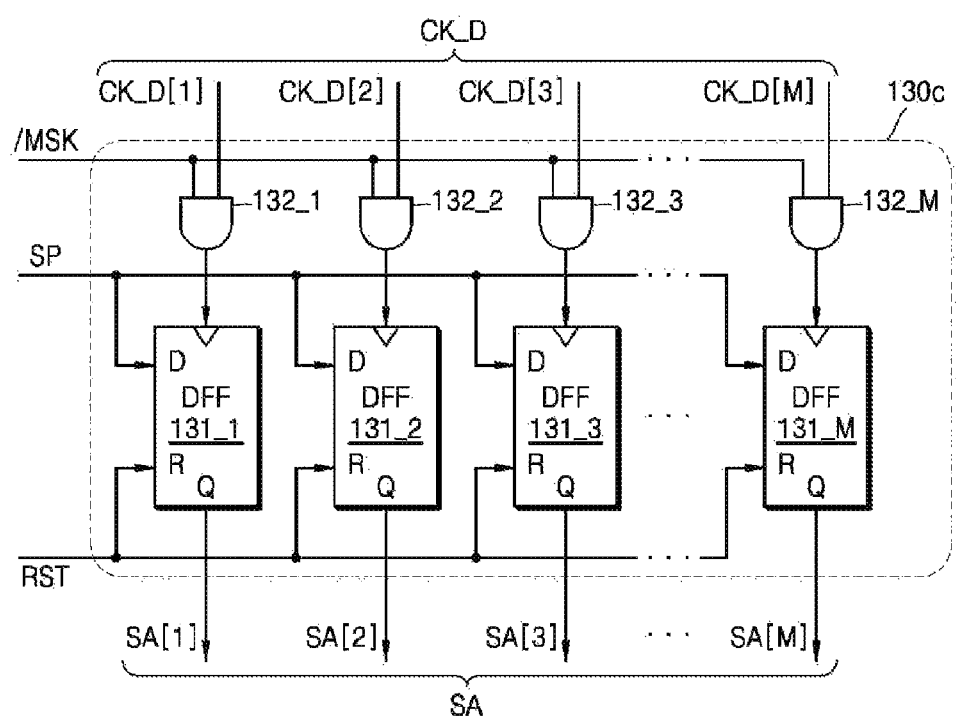
FIG. 12 is a block diagram of a latch block receiving output signals of the internal signal generator of FIG. 11, according to an example embodiment.

FIG. 11 is a block diagram of an internal signal generator 110c, which is an example of the internal signal generator 110 of FIG. 1, according to an example embodiment, and FIG. 12 is a block diagram of a latch block 130c receiving output signals of the internal signal generator 110c of FIG. 11, according to an example embodiment. Referring to FIG. 11, the internal signal generator 110c may include a frequency divider 112c, a period signal generator 114c, a reset signal generator 116c, and a mask signal generator 118c. The internal signal generator 110c of FIG. 11 may further include the mask signal generator 118c, compared with the internal signal generator 110a of FIG. 7. Hereinafter, descriptions of FIG. 11 which overlap with the descriptions of FIG. 7 are omitted.

According to the present example embodiment, the internal signal generator 110c may further generate a mask signal/MSK that is deactivated before a single pulse signal SP is activated and that is activated after the single pulse signal SP is deactivated. Referring to FIG. 11, the mask signal generator 118c may generate the mask signal/MSK. The mask signal/MSK may mask rising edges of delayed clock signals CK_D that overlap or are adjacent to an active pulse of the single pulse signal SP, and thus, the latch block 130c of FIG. 12 may stably latch the single pulse signal SP. In addition, the mask signal/MSK may prevent unnecessary rising edges of the delayed clock signals CK_D from being applied to a plurality of latch circuits of the latch block 130c, and thus, the power consumption of the latch block 130c may be reduced. In FIGS. 11 and 12, the mask signal/MSK is an active low signal and may have a low level "L" during activation and have a high level "H" during deactivation.

Referring to FIG. 12, the latch block 130c may include M flip-flops 131_1 to 131_M and M logical AND gates 132_1 to 132_M, and one logical AND gate and one flip-flop, which correspond to each other, may constitute one latch circuit. For example, a first flip-flop 131_1 and a first logical AND gate 132_1 may constitute one latch circuit.

The M logical AND gates 132_1 to 132_M may respectively receive M delayed clock signals CK_D[1] to CK_D[M] and may receive the mask signal/MSK in common. The M logical AND gates 132_1 to 132_M may provide a clock signal being in an inactive state to the M flip-flops 131_1 to 131_M by masking the M delayed clock signals CK_D[1] to CK_D[M] in response to an active mask signal/MSK, and may transmit the M delayed clock signals CK_D[1] to CK_D[M] to the M flip-flops 131_1 to 131_M in response to an inactive mask signal/MSK.

Each of the flip-flops 131_1 to 131_M may include a clock terminal to which an output signal of one of the M logical AND gates 132_1 to 132_M is input, a data terminal to which the single pulse signal SP is input, a reset terminal to which a reset signal RST is input, and an output terminal that outputs one of the M sampling signals SA[1] to SA[M]. For example, the first flip-flop 131_1 may receive an output of the first logical AND gate 132_1 through the clock terminal, may receive the single pulse signal SP through the data terminal, may receive the reset signal RST through the reset terminal, and may output the sampling signal SA[1] through the output terminal.

Figure 13:
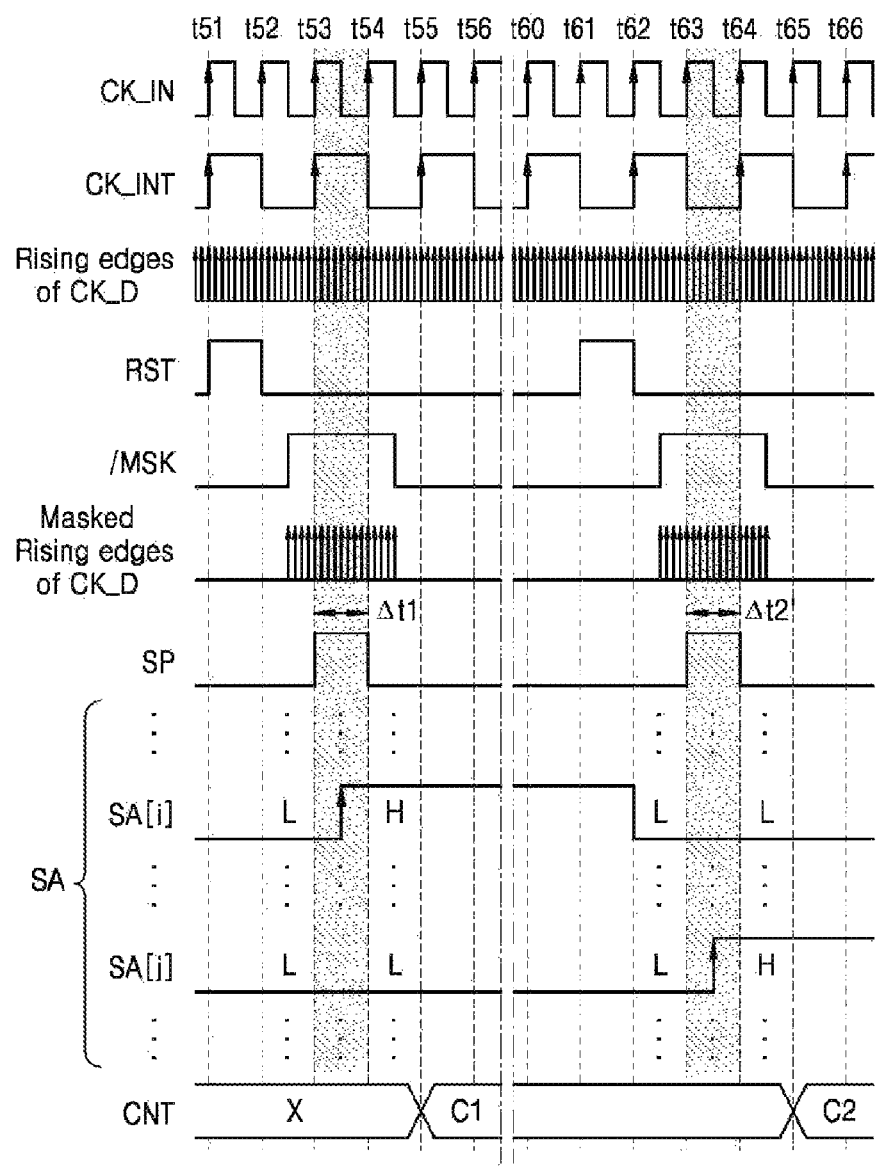
FIG. 13 is a timing diagram of output signals of the internal signal generator of FIG. 11 and the latch block of FIG. 12, according to an example embodiment.

FIG. 13 is a timing diagram of output signals of the internal signal generator 110c of FIG. 11 and the latch block 130c of FIG. 12, according to an example embodiment. As described above with reference to FIGS. 11 and 12, the internal signal generator 110c may include the mask signal generator 118c for generating the mask signal/MSK, and the latch block 130c may receive the mask signal/MSK and mask the delayed clock signals CK_D.

Referring to FIG. 13, the reset signal RST may be activated at a time t51 and be deactivated at a time t52. The mask signal/MSK may be deactivated (that is, transition from a low level "L" to a high level "H") between the time t52 and a time t53. In other words, before the single pulse signal SP is activated, the mask signal/MSK may be deactivated and thus the delayed clock signals CK_D may be transmitted to the flip-flops 131_1 to 131_M of the latch block 130c.

Referring to FIG. 13, the mask signal /MSK may be activated (that is, transition from a high level "H" to a low level "L") between a time t54 and a time t55. In other words, after the single pulse signal SP is deactivated, the mask signal/MSK may be activated and thus the delayed clock signals CK_D may be masked, and accordingly, the delayed clock signals CK_D may be blocked from being transmitted to the flip-flops 131_1 to 131_M of the latch block 130c. As a result, the mask signals/MSK may be deactivated during a period including a period Δt1 in which the single pulse signal SP is activated, and thus, unnecessary rising edges of the delayed clock signals CK_D may be blocked from being transmitted to the flip-flops 131_1 to 131_M of the latch block 130c. Similar to a time interval between the time t52 and the time t55, a mask signal/MSK that is deactivated during a period including an active pulse width Δt2 of the single pulse signal SP may be generated during a time interval between a time t62 and a time t65.

Figure 14A:
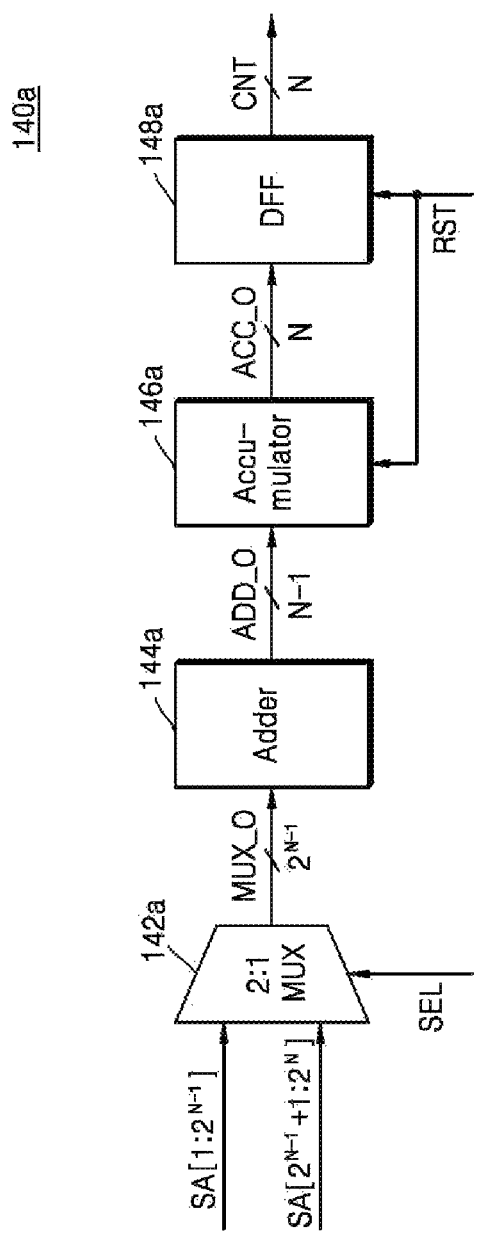
FIGS. 14A and 14B are block diagrams of count sub-circuits, which are examples of a count sub-circuit of FIG. 1, according to example embodiments.
Figure 14B:
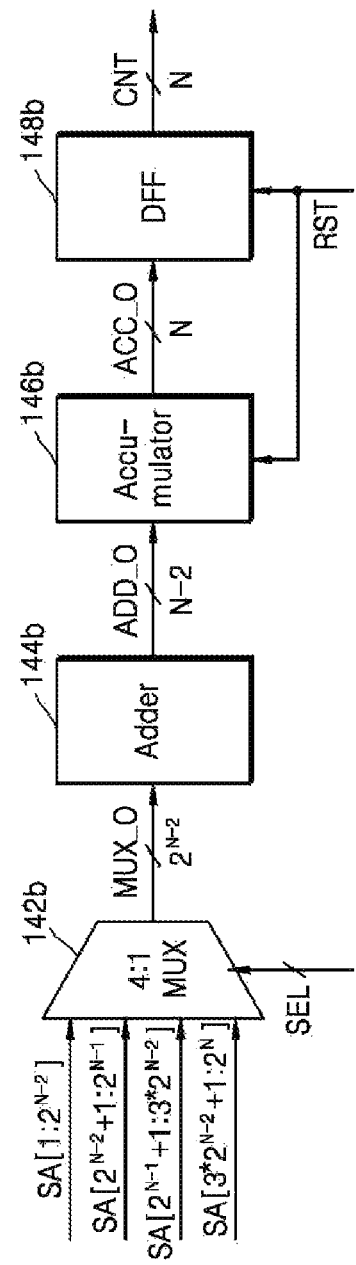

FIGS. 14A and 14B are block diagrams of count sub-circuits 140a and 140b, respectively, which are examples of the count sub-circuit 140 of FIG. 1, according to example embodiments. As described above with reference to FIG. 1, the count sub-circuit 140 of FIG. 1 may count the number of active sampling signals of the sampling signals SA output from the latch block 130 and output a count signal CNT indicating the number of active sampling signals of the sampling signals SA.

According to the present example embodiment, the count sub-circuit 140 may count the number of active sampling signals of the sampling signals SA in synchronization with the internal clock signal CK_INT during a plurality of successive periods of the internal clock signal CK_INT. The number of sampling signals SA (that is, the number of delay units of the delay block 120 in FIG. 1, the number of delayed clock signals CK_D, or the number of latch circuits of the latch block 130) may be determined by resolution for measuring a jitter of the input clock signal CK_IN. As described above with reference to FIGS. 2 and 3, when the delay block 120 includes the M delay units 121_1 to 121_M, the number of rising edges of delayed clock signals CK_D, which occur during a period of the internal clock signal CK_INT, may remain constant (e.g., the number of rising edges may be equal to M). Accordingly, when the number (that is, M) of delay units of the delay block 120 increases, resolution for measuring an active pulse width of the single pulse signal SP may increase. For example, the delay block 120 may include $2^{16}$ (65,536) delay units (that is, M=$2^{16}$), and the period of the internal clock signal CK_INT may have 65,536 resolution.

When M has a relatively great value, that is, when resolution for measuring an active pulse width of the single pulse signal SP is relatively high, it may be not easy for the count sub-circuit 140 of FIG. 1 to count all the active sampling signals of the M sampling signals SA during a short time (for example, the period of the input clock signal CK_IN or the period of the internal clock signal CK_INT), and a high cost (for example, large area or high power) may be required. Accordingly, as shown in FIGS. 14A and 14B, the count sub-circuit 140a or 140b may output a count signal CNT by sequentially counting some of the sampling signals SA over a plurality of periods of the internal clock signal CK_IN and adding count results together. FIG. 14A shows an example in which two groups of sampling signals obtained by separating the sampling signals SA are sequentially counted, and FIG. 14B shows an example in which four groups obtained by separating the sampling signals SA are sequentially counted. However, it will be understood that the inventive concept is not limited thereto. In FIGS. 14A and 14B, M is $2^N$ (where N is an integer that is equal to or greater than 3) and the count signal CNT is an N-bit signal. Hereinafter, descriptions of FIG. 14B which overlap with descriptions of FIG. 14A will be omitted.

Referring to FIG. 14A, the count sub-circuit 140a may include a 2-channel multiplexer 142a, an adder 144a, an accumulator 146a, and a flip-flop 148a. The 2-channel multiplexer 142a may receive sampling signals SA from the latch block 130 of FIG. 1 and may output some of the sampling signals SA in response to a selection signal SEL. For example, as shown in FIG. 14A, the 2-channel multiplexer 142a may be a $2^{N-1}$-bit 2-channel multiplexer, may receive a sampling signal group SA[1:$2^{N-1}$] including $2^{N-1}$ sampling signals as a first channel input, and may receive a sampling signal group SA[$2^{N-1}$+1:$2^N$] including $2^{N-1}$ sampling signals as a second channel input that does not overlap with the first channel input. The 2-channel multiplexer 142a may provide one of the sampling signal groups SA[1:$2^{N-1}$] and SA[$2^{N-1}$+1:$2^N$] to the adder 144a as a multiplexer output signal MUX_O in response to the selection signal SEL. As described below with reference to FIG. 15A, the selection signal SEL may be changed for each period of the internal clock signal CK_INT to sequentially select two channels, i.e., the first and second channels. The selection signal SEL may be generated by the count sub-circuit 140a in synchronization with the internal clock signal CK_INT, or may be generated by the internal signal generator 110 of FIG. 1.

The adder 144a may receive the multiplexer output signal MUX_O from the 2-channel multiplexer 142a and may add $2^{N-1}$ signals included in the multiplexer output signal MUX_O. In other words, the adder 144a may generate an (N-1)-bit adder output signal ADD_O by adding $2^{N-1}$ one-bit signals together.

The accumulator 146a may receive the (N-1)-bit adder output signal ADD_O from the adder 144a and accumulate the (N-1)-bit adder output signal ADD_O. In other words, the accumulator 146a may generate an N-bit accumulator output signal ACC_O by accumulating the (N-1)-bit adder output signal ADD_O twice. For example, the accumulator 146a may include an (N-1)-bit adder and an N-bit register, and the (N-1)-bit adder may add a value of the adder output signal ADD_O and a value stored in the N-bit register together. In addition, as shown in FIG. 14A, the accumulator 146a may receive a reset signal RST and may reset the accumulator output signal ACC_O (or the value stored in the N-bit register) to "0" in response to the activation of the reset signal RST.

The flip-flop 148a, which is an N-bit flip-flop, may latch the accumulator output signal ACC_O in synchronization with the reset signal RST. In other words, the flip-flop 148a may output an N-bit count signal CNT by latching the accumulator output signal ACC_O, which indicates a result obtained by accumulating the adder output signal ADD_O twice through the accumulator 146a, in response to the reset signal RST.

Referring to FIG. 14B, the count sub-circuit 140b may include a 4-channel multiplexer 142b, an adder 144b, an accumulator 146b, and a flip-flop 148b. When comparing the count sub-circuit 140b of FIG. 14B with the count sub-circuit 140a of FIG. 14A, the count sub-circuit 140b may sequentially count four groups of sampling signals SA and add count results together.

The 4-channel multiplexer 142b may be a $2^{N-2}$-bit 4-channel multiplexer, may receive a sampling signal group $SA[1:2^{N-2}]$ including $2^{N-2}$ sampling signals as a first channel input, and may receive a sampling signal group $SA[2^{N-2}+1:2^{N-1}]$ including $2^{N-2}$ sampling signals as a second channel input that does not overlap with the first channel input. Also, the 4-channel multiplexer 142b may receive a sampling signal group $SA[2^{N-1}+1:3*2^{N-2}]$ including $2^{N-2}$ sampling signals as a third channel input that does not overlap with the first and second channel inputs, and may receive a sampling signal group $SA[3*2^{N-2}+1:2^N]$ including $2^{N-2}$ sampling signals as a fourth channel input that does not overlap with the first to third channel inputs. The 4-channel multiplexer 142b may provide one of four sampling signal groups $SA[1:2^{N-2}]$, $SA[2^{N-2}+1:2^{N-1}]$, $SA[2^{N-1}+1:3*2^{N-2}]$, and $SA[3*2^{N-2}+1:2^N]$ to the adder 144b as a multiplexer output signal MUX_O in response to a selection signal SEL.

The adder 144b may receive the multiplexer output signal MUX_O from the 4-channel multiplexer 142b and may add $2^{N-2}$ signals included in the multiplexer output signal MUX_O. In other words, the adder 144b may generate an (N-2)-bit adder output signal ADD_O by adding $2^{N-2}$ one-bit signals together. The accumulator 146b may generate an N-bit accumulator output signal ACC_O by accumulating the (N-2)-bit adder output signal ADD_O four times.

As the number of sampling signal groups obtained by separating the sampling signals SA increases, a point in time at which a count signal CNT is output may be delayed. In other words, the count sub-circuit 140b of FIG. 14B may output the count signal CNT at a delayed point in time compared to the count sub-circuit 140a of FIG. 14A. Hereinafter, operations of the count sub-circuits 140a and 140b of FIGS. 14A and 14B will be described with reference to FIGS. 15A and 15B.

Figure 15A:
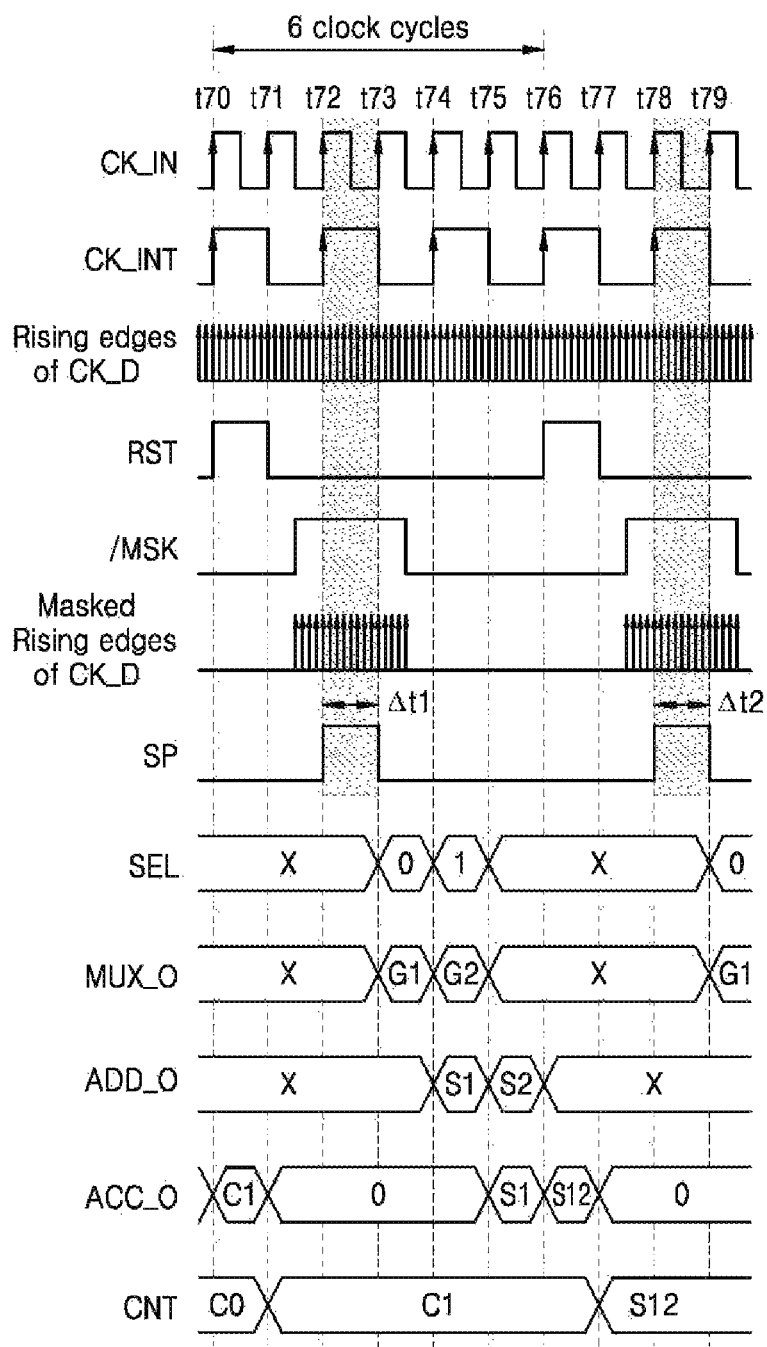
FIGS. 15A and 15B are timing diagrams showing operations of the count sub-circuits of FIGS. 14A and 14B, according to example embodiments.
Figure 15B:
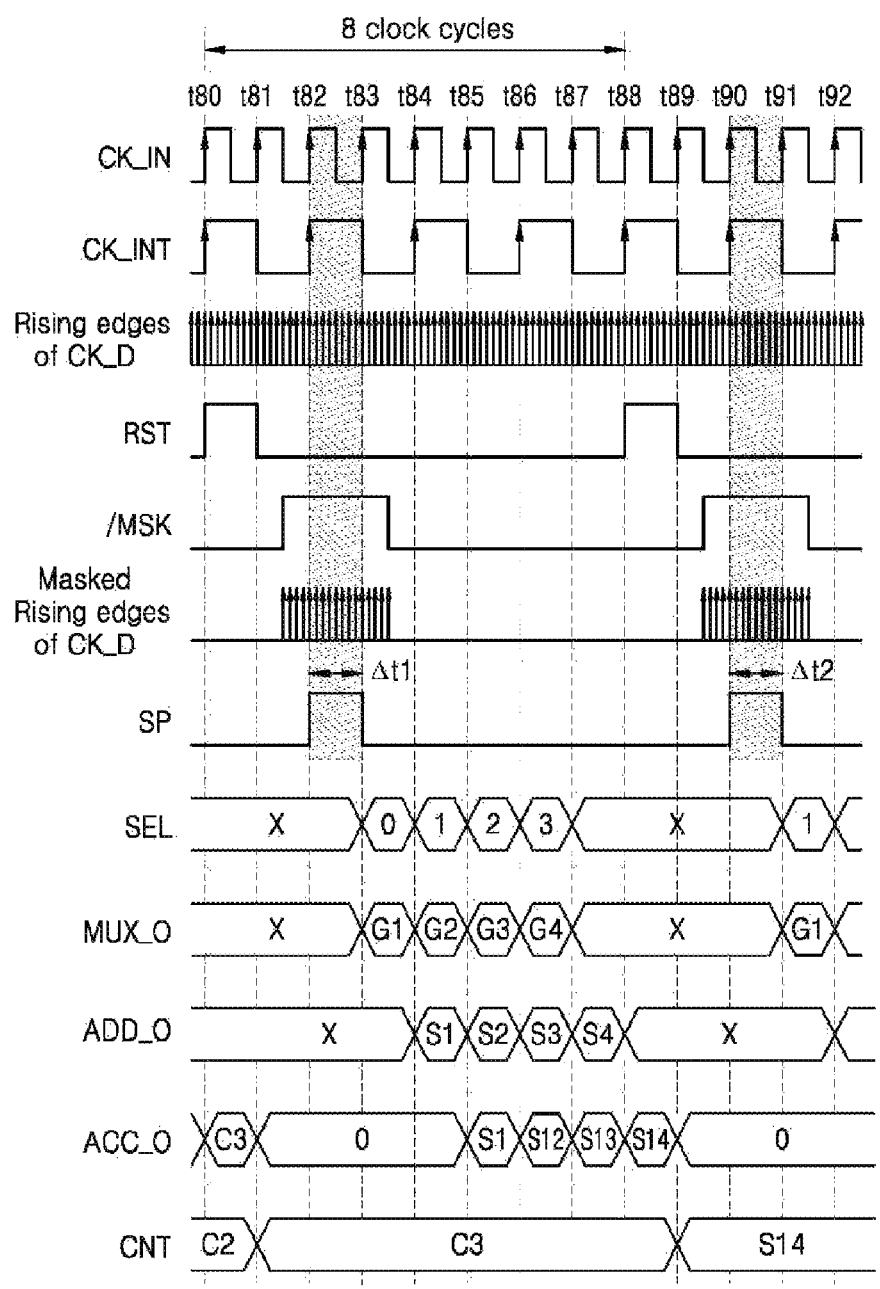

FIGS. 15A and 15B are timing diagrams showing operations of the count sub-circuits 140a and 140b of FIGS. 14A and 14B, respectively, according to example embodiments. As described above with reference to FIGS. 14A and 14B, the count sub-circuit 140a or 140b may count the number of active sampling signals of the sampling signals SA in synchronization with the internal clock signal CK_INT during a plurality of successive periods of the internal clock signal CK_INT. The timing diagrams of FIGS. 15A and 15B show example operations of the count sub-circuits 140a and 140b, and the count sub-circuits 140a and 140b may operate differently than shown in FIGS. 15A and 15B. Hereinafter, the timing diagram of FIG. 15A will be described with reference to FIG. 14A, and the timing diagram of FIG. 15B will be described with reference to FIG. 14B.

Referring to FIG. 15A, the reset signal RST may be activated at a time t70 and be deactivated at a time t71. The accumulator 146a may be reset in response to an active pulse of the reset signal RST, and the flip-flop 148a may latch the accumulator output signal ACC_O. In other words, as shown in FIG. 15A, the accumulator output signal ACC_O may be set to "0", and the count signal CNT may have a latched value "C1" corresponding to an active pulse width of the single pulse signal SP, generated before a time t70.

A mask signal/MSK may be deactivated (that is, transition from a low level "L" to a high level "H") between a time t71 and a time t72 before the single pulse signal SP is activated, and may be activated (that is, transition from a high level "H" to a low level "L") between a time t73 and a time t74 after the single pulse signal SP is deactivated.

The selection signal SEL may have a value of "0" at the time t73 to select a first channel input of the 2-channel multiplexer 142a, and the 2-channel multiplexer 142a may output a sampling signal group G1, which includes $2^{N-1}$ sampling signals of the sampling signals SA, as the multiplexer output signal MUX_O in response to the selection signal SEL.

The selection signal SEL may have a value of "1" at the time t74 to select a second channel input of the 2-channel multiplexer 142a, and the 2-channel multiplexer 142a may output a sampling signal group G2, which includes $2^{N-1}$ sampling signals that do not overlap with the first channel input from among the sampling signals SA, as the multiplexer output signal MUX_O in response to the selection signal SEL. In addition, the adder 144a may output a value "S1", obtained by adding sampling signals included in the sampling signal group G1, as the adder output signal ADD_O.

At a time t75, the adder 144a may output a value "S2", obtained by adding sampling signals included in the sampling signal group G2, as the adder output signal ADD_O. In addition, the accumulator 146a may accumulate the value "S1" of the adder output signal ADD_O and output the value "S1" as the accumulator output signal ACC_O.

At a time t76, the accumulator 146a may accumulate the value "S2" of the adder output signal ADD_O and output a value "S12" obtained by adding the value "S1" and the value "S2" together. In response to the reset signal RST activated during a time interval from a time t76 to a time t77, the flip-flop 148a may output the value "S12" as the count signal CNT by latching the accumulator output signal ACC_O at the time t77.

Referring to FIG. 15B, the reset signal RST may be activated at a time t80 and be deactivated at a time t81. The accumulator output signal ACC_O may be set to "0" in response to an active pulse of the reset signal RST, and the count signal CNT may latch a value "C3" corresponding to an active pulse width of the single pulse signal SP, generated before the time t80. A mask signal/MSK may be deactivated (that is, transition from a low level "L" to a high level "H") between the time t81 and a time t82 before the single pulse signal SP is activated, and may be activated (that is, transition from a high level "H" to a low level "L") between a time t83 and a time t84 after the single pulse signal SP is deactivated.

The selection signal SEL may have a value of "0" at the time t83 to select a first channel input of the 4-channel multiplexer 142b, and the 4-channel multiplexer 142b may output a sampling signal group G1, which includes $2^{N-2}$ sampling signals of the sampling signals SA, as the multiplexer output signal MUX_O in response to the selection signal SEL. Similarly, the selection signal SEL may sequentially have a value of "1", a value of "2", and a value of "3" at a time t84, a time t85, and a time 86 to select second to fourth channel inputs which do not overlap with each other, and the 4-channel multiplexer 142b may sequentially output sampling signal groups G2, G3, and G4 as the multiplexer output signal MUX_O in response to the selection signal SEL.

At the time t84, the time t85, the time 86, and a time 87, the adder 144b may sequentially output "S1", "S2", "S3", and "S4" as the adder output signal ADD_O by adding sampling signals included in each of the sampling signal groups G1, G2, G3, and G4. In addition, at the time t85, the time 86, the time 87, and a time 88, the accumulator 146b may sequentially output "S1", "S12 (i.e., S1+S2)", "S13 (i.e., S12+S3)", and "S14 (i.e., S13+S4)" as the accumulator output signal ACC_O by accumulating the adder output signal ADD_O. In response to the reset signal RST activated during a time interval from a time t88 to a time t89, the flip-flop 148a may output "S12" as the count signal CNT by latching the accumulator output signal ACC_O at the time t89.

As shown in FIG. 15A, according to the count sub-circuit 140a of FIG. 14A, an operation of measuring an active pulse width of the single pulse signal SP may be completed during 6 cycles (i.e., 6 clock periods) of the input clock signal CK_IN. On the other hand, as shown in FIG. 15B, according to the count sub-circuit 140b of FIG. 14B, an operation of measuring an active pulse width of the single pulse signal SP may be completed during 8 cycles (i.e., 8 clock periods) of the input clock signal CK_IN. According to the present example embodiment, the number of sampling signal groups and the configurations of the count sub-circuits 140a and 140b may be determined in consideration of the frequency of the input clock signals CK_IN and the sizes and powers of the count sub-circuits 140a and 140b.

In one embodiment, the internal signal generator 110 of FIG. 1 may generate a pulse signal having an activated period of time during 1 to n-1 clock periods for every set of n clock periods of the input clock signal, the n may be a positive integer equal to or greater than 3. For example, a pulse width of the single pulse signal SP may have a duration of 1 cycle or 2 cycles of the input clock signal CK_IN, and the single pulse signal SP may be periodically generated once in every 3 cycles.

Figure 16A:
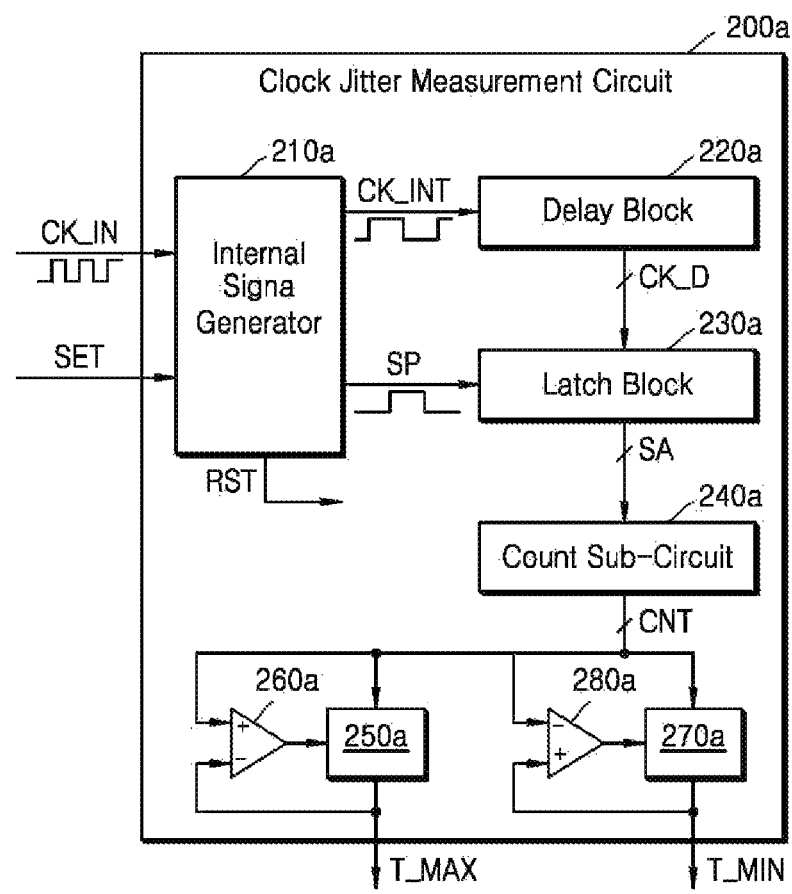
FIGS. 16A and 16B are block diagrams of clock jitter measurement circuits according to example embodiments.
Figure 16B:
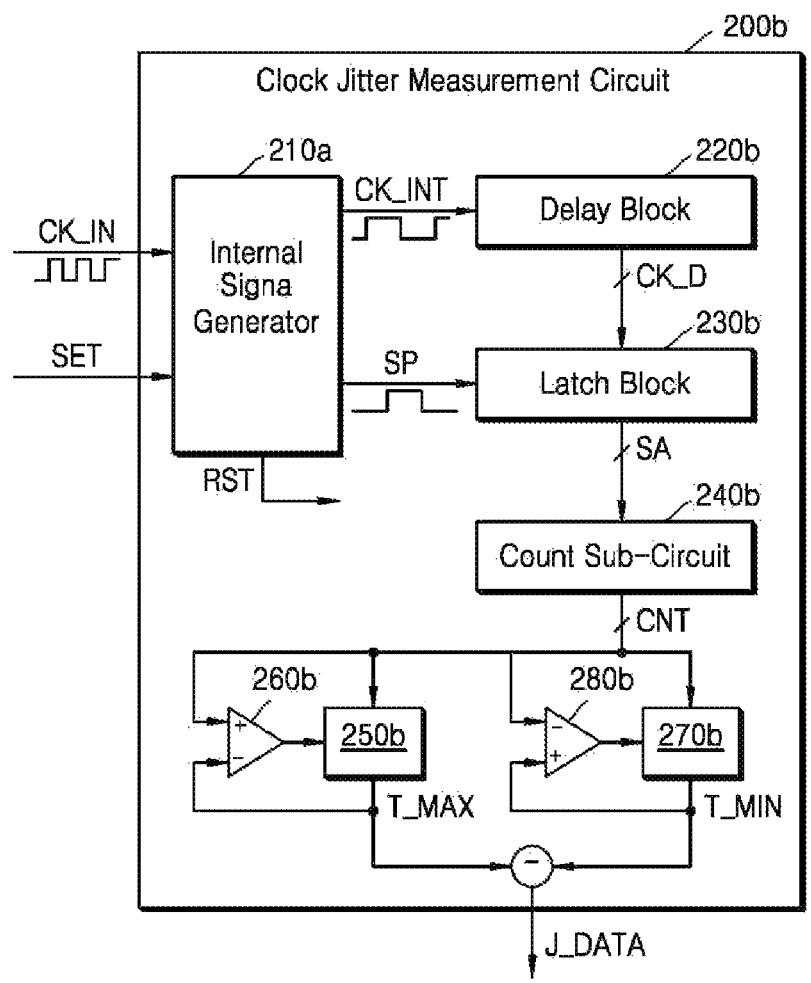

FIGS. 16A and 16B are block diagrams of clock jitter measurement circuits 200a and 200b, respectively, according to example embodiments. As shown in FIGS. 16A and 16B, each of the clock jitter measurement circuits 200a and 200b may extract a maximum value and a minimum value from among clock periods measured several times. In other words, each of the clock jitter measurement circuit 200a and 200b may extract a maximum value and a minimum value from among a plurality of values of a count signal CNT that is output from each of count sub-circuits 240a and 240b, and a difference between an extracted maximum value and an extracted minimum value may correspond to a jitter of an input clock signal CK_IN.

Referring to FIG. 16A, the clock jitter measurement circuit 200a may include an internal signal generator 210a, a delay block 220a, a latch block 230a, a count sub-circuit 240a, first and second registers 250a and 270a, and first and second comparators 260a and 280a. The clock jitter measurement circuit 200a of FIG. 16A may further include the first and second registers 250a and 270a and the first and second comparators 260a and 280a, compared to the clock jitter measurement circuit 100 of FIG. 1. As shown in FIG. 16A, the clock jitter measurement circuit 200a may output a signal T_MAX indicating a maximum value of a plurality of values of the count signal CNT and a signal T_MIN indicating a minimum value of the plurality of values of the count signal CNT.

The first register 250a may store a maximum value of the plurality of values of the count signal CNT. To this end, the first comparator 260a may receive the count signal CNT and an output signal (i.e., the signal T_MAX) of the first register 250a and may compare a value of the count signal CNT and a value of the output signal T_MAX of the first register 250a. When the value of the count signal CNT is greater than the value of the output signal T_MAX of the first register 250a, the value of the count signal CNT may be stored in the first register 250a in response to an active output signal of the first comparator 260a. On the other hand, when the value of the count signal CNT is not greater than the value of the output signal T_MAX of the first register 250a, a value stored in the first register 250a may be maintained in response to an inactive output signal of the first comparator 260a.

Similarly, the second register 270a may store a minimum value of the plurality of values of the count signal CNT. To this end, the second comparator 280a may receive the count signal CNT and an output signal (i.e., the signal T_MIN) of the second register 270a and may compare a value of the count signal CNT and a value of the output signal T_MIN of the second register 270a. When the value of the count signal CNT is less than the value of the output signal T_MIN of the second register 270a, the value of the count signal CNT may be stored in the second register 270a in response to an active output signal of the second comparator 280a. On the other hand, when the value of the count signal CNT is not less than the value of the output signal T_MIN of the second register 270a, a value stored in the second register 270a may be maintained in response to an inactive output signal of the second comparator 280a.

Referring to FIG. 16A, the internal signal generator 210a may receive a setting signal SET from the outside. The setting signal SET may set the number of values of the count signal CNT from which the maximum value and the minimum value are extracted, or may set a period for which the maximum value and the minimum value are extracted. For example, the setting signal SET may set the number of values of the count signal CNT, from which the maximum value and the minimum value are extracted, to several hundred to tens of thousands, or may set a period, for which the maximum value and the minimum value are extracted, to several milliseconds through several seconds.

The setting signal SET may also set a signal to be output from the clock jitter measurement circuit 200a representing at least one of the number of values of the count signal CNT from which the maximum value, the minimum value and a current count value are extracted.

In example embodiments, the setting signal SET may include an enable signal to decide whether the internal signal generator 210a operates. For example, the clock jitter measurement circuit 200a may need to operate when a semiconductor device including the clock jitter measurement circuit 200a operates in a test operation and the clock jitter measurement circuit 200a may not need to operate when the semiconductor device including the clock jitter measurement circuit 200a operates in a normal operation. Thus, the enable signal has a logic low level when the semiconductor device is in the normal operation and the enable signal has a logic high level when the semiconductor device is in the test operation.

Referring to FIG. 16B, the clock jitter measurement circuit 200b may include an internal signal generator 210b, a delay block 220b, a latch block 230b, a count sub-circuit 240b, first and second registers 250b and 270b, first and second comparators 260b and 280b, and a subtractor 290b. The clock jitter measurement circuit 200b of FIG. 16B may further include the subtractor 290b, compared to the clock jitter measurement circuit 200a of FIG. 16A. In other words, while the clock jitter measurement circuit 200a of FIG. 16A outputs the signal T_MAX indicating the maximum value and the signal T_MIN indicating the minimum value, the clock jitter measurement circuit 200b of FIG. 16B may output a signal J_DATA corresponding to a difference between the maximum value and the minimum value.

Figure 17A:
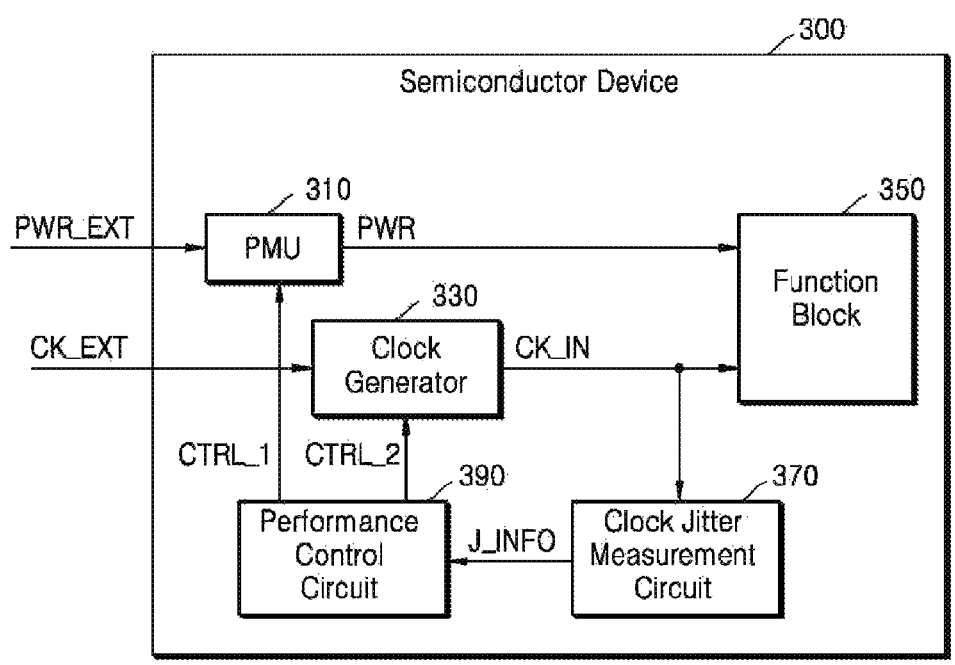
FIGS. 17A and 17B are block diagram of semiconductor devices, each of which includes a clock jitter measurement circuit, according to example embodiments.
Figure 17B:
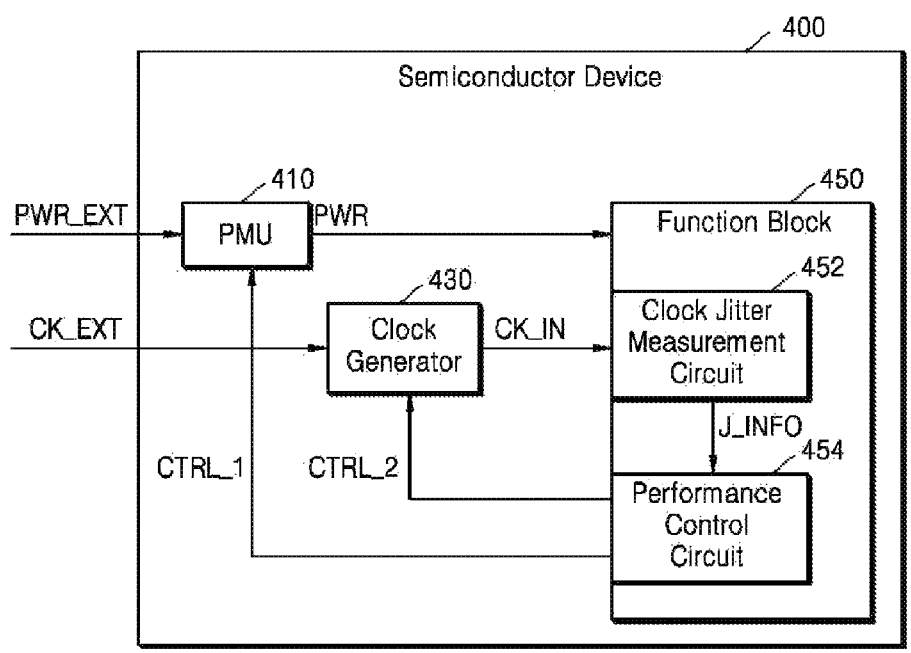

FIGS. 17A and 17B are block diagram of semiconductor devices 300 and 400 including clock jitter measurement circuits 370 and 452, respectively, according to example embodiments. As described above, clock jitter measurement circuit according to the present example embodiments may be digitally synthesized since it does not include an analog device such as an amplifier, and thus, the clock jitter measurement circuit may be easily modularized and be easily implemented in a semiconductor device including a digital circuit. The semiconductor device may adjust operating parameters so that the performance of a digital circuit (for example, function blocks 350 and 450 of FIGS. 17A and 17B) included in the semiconductor device is optimized based on clock jitter measured by the clock jitter measurement circuit.

As shown in FIG. 17A, the clock jitter measurement circuit 370 may be disposed outside the function block 350, and as shown in FIG. 17B, the clock jitter measurement circuit 452 may be disposed in the function block 450. The semiconductor devices 300 and 400 of FIGS. 17A and 17B may be processors, such as an application processor (AP), a central processing unit (CPU), and a graphic processing unit (GPU), may be memory devices including a flash memory and/or dynamic random access memory (DRAM), or may be system on chips (SoC) including a processor and a memory.

Referring to FIG. 17A, the semiconductor device 300 may include a power management unit 310, a clock generator 330, a function block 350, clock jitter measurement circuit 370, and a performance control circuit 390. In example embodiments, the clock generator 330 may be at least one of a phase locked loop (PLL), a delay locked loop (DLL) and an oscillator. The power management unit 310 may receive an external power PWR_EXT from the outside of the semiconductor device 300 and may provide a power supply voltage PWR to the function block 350 and one or more circuits of the semiconductor device 300. The power management unit 310 may receive a first control signal CTRL1 from the performance control circuit 390 and may adjust the power PWR, which is supplied to the function block 350, in response to the first control signal CTRL1. For example, the power management unit 310 may increase or decrease a voltage, which is supplied to the function block 350, in response to the first control signal CTRL1 and may block the supply of the voltage.

The clock generator 330 may receive an external clock signal CK_EXT from the outside of the semiconductor device 300, and may generate a clock signal CK and supply the clock signal CK to the function block 350. The clock generator 330 may receive a second control signal CTRL2 from the performance control circuit 390 and may adjust the clock signal CK, which is supplied to the function block 350, in response to the second control signal CTRL2. For example, the clock generator 330 may increase or decrease the frequency of the clock signal CK, which is supplied to the function block 350, in response to the second control signal CTRL2 and may gate the clock signal CK.

In example embodiments, the function block 350 may be a hardware block that operates in synchronization with the clock signal CK_IN. For example, the function block 350 may be a processor executing instructions, or may be a logic block designed to perform a specific function. The performance of the function block 350 may be determined by the power PWR supplied from the power management unit 310 and the clock signal CK received from the clock generator 330. For example, the function block 350 may have a high performance when a power PWR providing a relatively high voltage and a clock signal CK_IN having a relatively high frequency are supplied.

In example embodiments, the function block 350 may include one or more circuits that operate in synchronization with the clock signal CK_IN. For example, the function block 350 may be a peripheral circuit (e.g., an address buffer, a decoder, a control circuit, etc.) executing a write operation or a read operation of the semiconductor device 300.

The clock jitter measurement circuit 370 may receive the clock signal CK and may output a jitter information signal J_INFO by measuring a jitter of the clock signal CK. For example, the clock jitter measurement circuit 370 may output the count signal CNT corresponding to the period of the clock signal CK, as shown in FIG. 1, as the jitter information signal J_INFO. Also, the clock jitter measurement circuit 370 may output a maximum value and a minimum value of the period of the clock signal CK during a predetermined time interval, as shown in FIG. 16A, and may output a difference between the maximum value and the minimum value, as shown in FIG. 16B.

The performance control circuit 390 may determine a jitter of the clock signal CK based on the jitter information signal J_INFO received from the clock jitter measurement circuit 370. For example, the performance control circuit 390 may know the number (for example, "M" in FIG. 3) of delay units of the clock jitter measurement circuit 370 in advance and thus may determine a jitter of the clock signal CK based on a value of the jitter information signal J_INFO. In addition, when the clock jitter measurement circuit 370 outputs the count signal CNT, which corresponds to the period of the clock signal CK, as the jitter information signal J_INFO, the performance control circuit 390 may extract a maximum value and a minim value from among a plurality of values of the jitter information signal J_INFO.

The performance control circuit 390 may adjust the performance of the function block 350 based on a determined jitter of the clock signal CK. For example, if it is determined that a jitter of the clock signal CK is higher than a reference value, the performance control circuit 390 may decrease the voltage of the power PWR, which is supplied to the function block 350, by controlling the power management unit 310 through the first control signal CTRL1, or may decrease the frequency of the clock signal CK, which is supplied to the function block 350, by controlling the clock generator 330 through the second control signal CTRL2. On the other hand, if it is determined that a jitter of the clock signal CK is lower than the reference value, the performance control circuit 390 may increase the voltage of the power PWR, which is supplied to the function block 350, by controlling the power management unit 310 through the first control signal CTRL1, or may increase the frequency of the clock signal CK, which is supplied to the function block 350, by controlling the clock generator 330 through the second control signal CTRL2. According to an example embodiment, the performance control circuit 390 may include a look-up table and may generate the first and second control signals CTRL1 and CTRL2 based on the determined jitter of the clock signal CK and the look-up table.

Referring to FIG. 17B, the semiconductor device 400 may include a power management unit 410, a clock generator 430, and a function block 450, and the function block 450 may include clock jitter measurement circuit 452 and a performance control circuit 454. In example embodiments, the clock generator 430 may be at least one of a PLL, a DLL and an oscillator. According to an example embodiment, the semiconductor device 400 may include a plurality of function blocks, and some of the plurality of function blocks may include clock jitter measurement circuit and a performance control circuit, as shown in FIG. 17B, and thus, the performance thereof may be adjusted based on a jitter of the clock signal CK.

Although FIGS. 17A and 17B show examples in which the performance control circuits 390 and 454 generate two control signals, i.e., the first and second control signals CTRL1 and CTRL2, the inventive concept is not limited thereto. In example embodiments, the performance control circuit 390 may generate only a control signal for controlling one selected from among the power management unit 310 and the clock generator 330, and the performance control circuit 454 may also generate only a control signal for controlling one selected from among the power management unit 410 and the clock generator 430.

Figure 18:
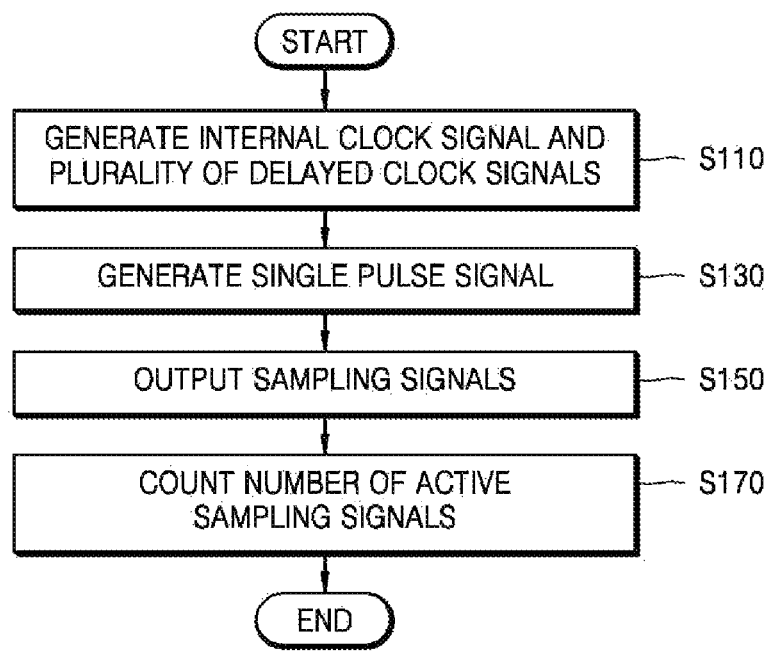
FIGS. 18 and 19 are flowcharts illustrating a method of measuring clock jitter, according to example embodiments.
Figure 19:
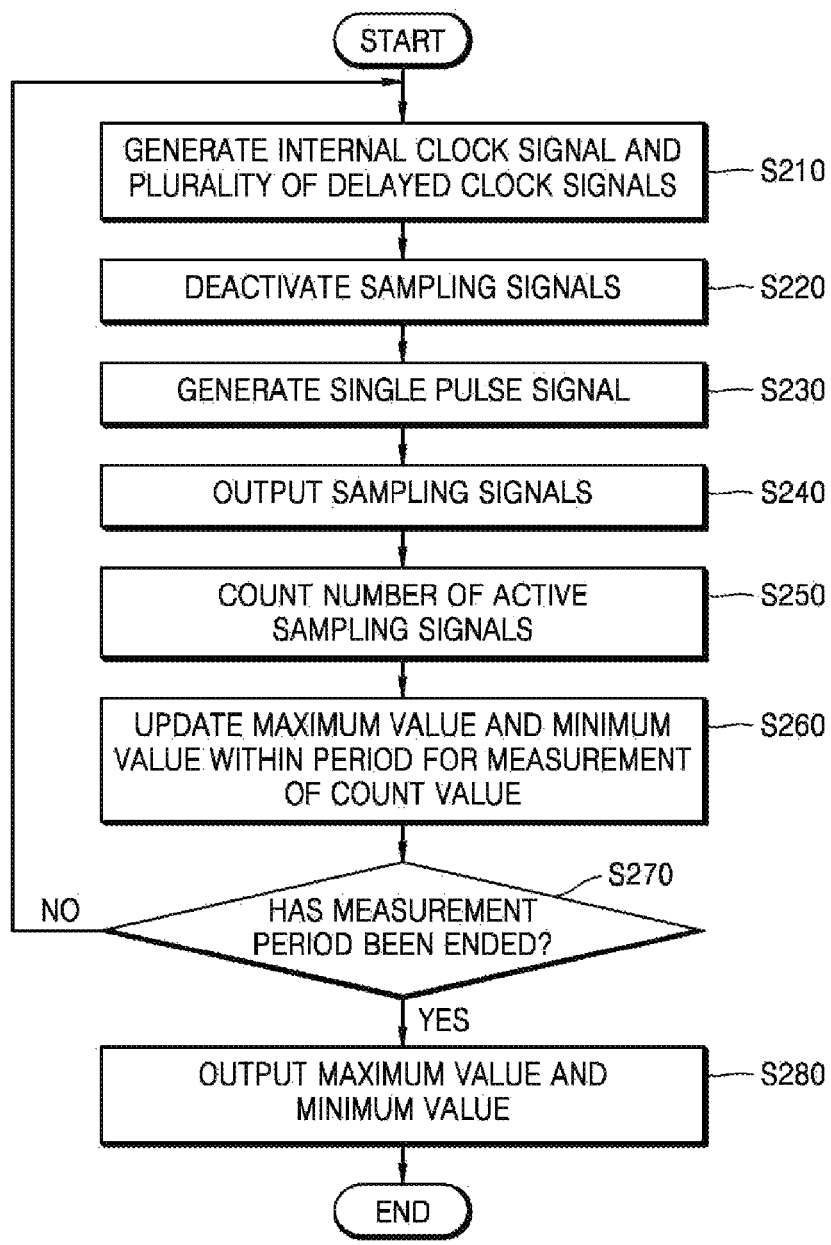

FIGS. 18 and 19 are flowcharts illustrating a method of measuring clock jitter, according to example embodiments. Specifically, FIG. 18 illustrates a method of measuring the period of a clock signal to measure clock jitter, and FIG. 19 illustrates a method of measuring a jitter of the clock signal based on a plurality of periods of the clock signal.

Referring to FIG. 18, an operation of generating an internal clock signal and a plurality of delayed clock signals may be performed in operation S110. The internal clock signal, which is a signal synchronized with an input clock signal, may be generated by dividing the input clock signal and may have a frequency that is equal to or less than that of the input clock signal. As the internal clock signal passes through each of a plurality of delay units connected in series with each other, a plurality of delayed clock signals may be generated. As described above with reference to FIGS. 3 and 4, when the number of delay units connected in series is M, the number of rising edges of the delayed clock signals, which occur within the period of the internal clock signal, may be constant as M regardless of a delay time variation of each of the delay units, which occurs due to a nose, or a PVT variation.

In operation S130, an operation of generating a single pulse signal may be performed. The single pulse signal may be synchronized with the input clock signal, and an active pulse width of the single pulse signal may correspond to the period of the input clock signal. For example, the active pulse width of the single pulse signal may be equal to the period of the input clock signal, or may be proportional to the period of the input clock signal. The period of the input clock signal may be measured by measuring the active pulse width of the single pulse signal.

In operation S150, an operation of outputting sampling signals may be performed. A plurality of latch circuits corresponding to the plurality of delay units may output the sampling signals by latching the single pulse signal in synchronization with the plurality of delayed clock signals. In other words, a latch circuit, which receives a delayed clock signal having a rising edge within the active pulse width of the single pulse signal, may output an active sampling signal, and a latch circuit, which receives a delayed clock signal, which does not have a rising edge within the active pulse width of the single pulse signal, may output an inactive sampling signal.

In operation S170, an operation of counting the number of active sampling signals may be performed. The number of active sampling signals included among the sampling signals generated in operation S150 may be proportional to the active pulse width of the single pulse signal, and thus, the active pulse width of the single pulse signals, that is, the period of the input clock signals, may be measured by counting the number of active sampling signals. According to an example embodiment, as shown in FIGS. 15A and 15B, operation S170 may be performed in synchronization with the internal clock signal during a plurality of successive periods of the internal clock signal.

Referring to FIG. 19, in operation S210, an operation of generating an internal clock signal and a plurality of delayed clock signals may be performed, similar to operation S110 of FIG. 18.

In operation S220, an operation of deactivating sampling signals may be performed. Since the period of the internal clock signal is repeatedly measured, all the sampling signals may be deactivated to deactivate sampling signals activated depending on a previously measured period of the input clock signal.

In operation S230, an operation of generating a single pulse signal may be performed, similar to operation S130 of FIG. 18. In operation S240, an operation of outputting sampling signals may be performed, similar to operation S150 of FIG. 18. In operation S250, an operation of counting the number of active sampling signals may be performed, similar to operation S170 of FIG. 18.

In operation S260, an operation of updating a maximum value and a minimum value may be performed within a period for the measurement of a count value. In order to measure a jitter of the input clock signal, the period of the input clock signal may be measured several times, and by updating a maximum value and a minimum value of values counted in operation S250 during the measurement period, the maximum value and the minimum value may be extracted when the measurement period is ended.

In operation S270, an operation of determining whether the measurement period has been ended may be performed. For example, in order to measure the periods of the input clock signal, the number of measurements of the periods of the input clock signal may be set in advance, or a duration the periods of the input clock signal are measured may be set in advance. When the number of measurements of the periods of the input clock signal does not reach a predetermined number or the duration the periods of the input clock signal are measured does not elapse, an operation of generating an internal clock signal and a plurality of delayed clock signals may be performed in operation S210 again. On the other hand, when the number of measurements of the periods of the input clock signal reaches the predetermined number or the duration the periods of the input clock signal are measured elapses, the maximum value and the minimum value may be determined. A difference between the maximum value and the minimum value may be proportional to a jitter of the input clock signal.

In operation S280, the determined maximum value and the determined minimum value may be output. According to an example embodiment, the method of FIG. 19 may further include an operation of subtracting the maximum value and the minimum value, and thus, a difference between the maximum value and the minimum value may be output instead of the maximum value and the minimum value, as shown in FIG. 16B.

While the inventive concept has been particularly shown and described with reference to example embodiments thereof, it will be understood that various changes in form and details may be made therein without departing from the spirit and scope of the following claims.

What is claimed is:

1. A circuit for measuring clock jitter, the circuit comprising:
    an internal signal generator configured to generate an internal clock signal and a single pulse signal, respectively synchronized with an input clock signal;
    a plurality of delay units connected in series with each other and configured to generate respective delayed clock signals, wherein the internal clock signal sequentially passes through the plurality of delay units;
    a plurality of latch circuits configured to latch the single pulse signal in synchronization with the respective delayed clock signals, and output sampling signals; and
    a count sub-circuit configured to output a count value resulting from counting a number of active sampling signals from among the sampling signals.

2. The circuit of claim 1, wherein the internal signal generator comprises a period signal generator configured to generate the single pulse signal, and the single pulse signal has an active pulse width that is proportional to a period of the input clock signal,
    wherein the counted number of active sampling signals is proportional to the period of the input clock signal.

3. The circuit of claim 2, further comprising:
    a first register and a second register; and
    a first comparator and a second comparator configured to compare the count value with values stored in the first and second registers, respectively,
    wherein the first register is updated based on an output signal of the first comparator and stores a maximum value indicating a highest number of active sampling signals counted by the count sub-circuit during a predetermined period, and the second register is updated based on an output signal of the second comparator and stores a minimum value indicating a lowest number of active sampling signals counted by the count sub-circuit during the predetermined period, and
    wherein a difference between the maximum value and the minimum value is proportional to jitter of the input clock signal.

4. The circuit of claim 1, wherein the internal signal generator comprises a duty signal generator configured to generate the single pulse signal, and the single pulse signal has an active pulse width that is proportional to a positive pulse width or negative pulse width of the input clock signal, wherein a ratio of delay units to the counted number of active sampling signals is proportional to a duty cycle of the input clock signal.

5. The circuit of claim 1, wherein the internal signal generator comprises a clock divider configured to generate the internal clock signal by dividing the input clock signal.

6. The circuit of claim 1, wherein each of the plurality of latch circuits comprises a flip-flop,
    wherein the flip-flop comprises:
        a clock terminal to which one of the delayed clock signals is input;
        a data terminal to which the single pulse signal is input; and
        an output terminal that outputs one of the sampling signals.

7. The circuit of claim 1, wherein the plurality of latch circuits are configured to receive a reset signal for setting the sampling signals to an inactive state, and
    wherein the internal signal generator further generates the reset signal, wherein the reset signal transitions from an active state to an inactive state before the single pulse signal transitions to an active state.

8. The circuit of claim 1, wherein the internal signal generator comprises a mask signal generator configured to generate a mask signal,
    wherein the mask signal transitions from an active state to an inactive state before the single pulse signal transitions from an inactive state to an active state, and the mask signal transitions from the inactive state to the active state after the single pulse signal transitions from the active state to the inactive state, and
    wherein the plurality of latch circuits latch the single pulse signal in synchronization with a part of the delayed clock signals not masked by the mask signal from among the delayed clock signals.

9. The circuit of claim 1, wherein the count sub-circuit is configured to count the active sampling signals in synchronization with the internal clock signal during a plurality of successive periods of the internal clock signal.

10. The circuit of claim 1, wherein the number of delay units is $2^N$ and the number of latch circuits is $2^N$, where N is an integer that is equal to or greater than 2, and
    wherein the sampling signals comprise $2^N$ signals, and the count sub-circuit generates an N-bit output signal based on the counted number of active sampling signals.

11. The circuit of claim 10, wherein the count sub-circuit comprises:
    an adder configured to add $2^{N-2}$ one-bit signals together and generate an (N−2)-bit signal;
    an accumulator configured to accumulate the (N−2)-bit signal generated by the adder and generate the N-bit output signal; and
    a multiplexer connected to 4 channels and configured to receive the sampling signals from the plurality of latch devices and provide the $2^{N-2}$ one-bit signals to the adder.

12. The circuit of claim 11, wherein the multiplexer receives a selection signal for selecting one of the 4 channels,
    wherein the internal signal generator generates the selection signal, and the multiplexer sequentially selects each of the 4 channels during a plurality of successive periods of the internal clock signal, based on the selection signal.

13. The circuit of claim 1, wherein the circuit for measuring clock jitter is an integrated circuit including a plurality of standard cells.

14. A semiconductor device comprising:
a clock generator configured to generate an input clock signal in synchronization with an external clock signal;
an internal signal generator configured to generate an internal clock signal in synchronization with the input clock signal, and generate a pulse signal having an active period of time during 1 to n−1 clock periods for every set of n clock periods of the input clock signal, n being equal to or greater than 3;
a plurality of unit cells connected in series with each other, and configured to generate sampling signals based on the pulse signal and a plurality of delayed clock signals that are generated by sequentially delaying the input clock signal; and
a count circuit configured to output a jitter information signal based on a count value resulting from counting a number of active sampling signals from among the sampling signals during the active period of time of the pulse signal,
wherein the clock generator is configured to adjust the input clock signal based on the jitter information signal.

15. The semiconductor device of claim 14, further comprising:
a performance control circuit configured to generate a control signal based on the jitter information signal, and provide the control signal to the clock generator,
wherein the clock generator is configured to adjust the input clock signal based on the control signal of the performance control circuit.

16. The semiconductor device of claim 14, wherein a clock period of the internal clock signal is greater than a clock period of the input clock signal, and
wherein the active period of time of the pulse signal is the same as the clock period of the input clock signal.

17. The semiconductor device of claim 14, wherein the clock generator includes at least one of a phase locked loop (PLL), a delay locked loop (DLL) and an oscillator.

18. The semiconductor device of claim 14, wherein each of the plurality of unit cells includes:
a delay unit configured to generate one of the delayed clock signals; and
a latch circuit configured to generate one of the active sampling signals by latching the single pulse signal in synchronization with one of the delayed clock signals.

19. The semiconductor device of claim 18, wherein each of the plurality of unit cells further includes:
an AND gate configured to block one of the delayed clock signals in response to a mask signal,
wherein the internal signal generator configured to generate the mask signal in synchronization with the input clock signal.

20. The semiconductor device of claim 14, wherein the internal signal generator is configured to generate the pulse signal repeatedly, and
wherein the count circuit is configured to count a number of active sampling signals during the active period of time of each of a plurality of pulse signals.

* * * * *